(12) United States Patent
Fukuda et al.

(10) Patent No.: US 10,408,417 B2
(45) Date of Patent: Sep. 10, 2019

(54) LIGHT-EMITTING DEVICE WITH LIGHT FLUX CONTROL MEMBER HAVING PRISMATIC ELEMENTS ON BOTTOM SURFACE FORMING ACUTE ANGLE WITH SIDE EDGE OF LIGHT SOURCE

(71) Applicant: Enplas Corporation, Saitama (JP)

(72) Inventors: Yasuyuki Fukuda, Saitama (JP); Ryo Nonaka, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 51 days.

(21) Appl. No.: 15/533,752

(22) PCT Filed: Oct. 29, 2015

(86) PCT No.: PCT/JP2015/080592
§ 371 (c)(1),
(2) Date: Jun. 7, 2017

(87) PCT Pub. No.: WO2016/092974
PCT Pub. Date: Jun. 16, 2016

(65) Prior Publication Data
US 2017/0328537 A1 Nov. 16, 2017

(30) Foreign Application Priority Data
Dec. 8, 2014 (JP) ................... 2014-248086

(51) Int. Cl.
*F21V 5/04* (2006.01)
*F21S 2/00* (2016.01)
(Continued)

(52) U.S. Cl.
CPC .................... *F21V 5/04* (2013.01);
*F21S 2/00* (2013.01); *F21V 5/00* (2013.01);
*G02B 5/0215* (2013.01);
(Continued)

(58) Field of Classification Search
CPC .......... F21V 5/002; F21V 5/005; F21V 5/046; F21V 7/04; G02B 3/02; G02B 3/04
See application file for complete search history.

(56) References Cited

U.S. PATENT DOCUMENTS 7,798,679 B2 * 9/2010 Kokubo .................. F21V 5/048
362/335
7,806,580 B2 * 10/2010 Lin ........................... F21K 9/00
362/235

(Continued)

FOREIGN PATENT DOCUMENTS

JP 2006-114863 A 4/2006
JP 2011-091022 A 5/2011
(Continued)

OTHER PUBLICATIONS

International Search Report from International Application No. PCT/JP2015/080592 dated Dec. 28, 2015.

(Continued)

*Primary Examiner* — Ismael Negron
(74) *Attorney, Agent, or Firm* — Brundidge & Stanger, P.C.

(57) ABSTRACT

A light-emitting element includes a rectangular light emitting element with four edge surfaces; and a light flux control member defining a central axis and having a back surface, light entry surface formed as a recess in the back surface, a light emission surface disposed opposite the back surface, and a plurality of protruding elements forming a grid on the back surface. The grid of protruding elements include a plurality of linear ridges/valleys such that the angles formed by such linear ridges/valley and a plane including at least one of the edge surfaces of the light emitting element is an acute angle; or the grid of protruding element include a plurality of annular ridges/valley centered about the central (Continued)

axis, and a plurality of linear ridges/valleys disposed radially around the central axis.

12 Claims, 19 Drawing Sheets

(51) Int. Cl.
    *F21V 5/00*           (2018.01)
    *H01L 33/58*         (2010.01)
    *G02B 5/02*          (2006.01)
    *G02B 19/00*         (2006.01)
    *F21Y 115/10*       (2016.01)

(52) U.S. Cl.
    CPC ......... *G02B 5/0231* (2013.01); *G02B 5/0284* (2013.01); *G02B 19/0014* (2013.01); *G02B 19/0028* (2013.01); *G02B 19/0061* (2013.01); *H01L 33/58* (2013.01); *F21Y 2115/10* (2016.08)

(56) References Cited

U.S. PATENT DOCUMENTS

| | | | | |
|---|---|---|---|---|
| 7,810,983 B2* | 10/2010 | Chang | .................. | G02B 3/0056 362/612 |
| 7,866,844 B2* | 1/2011 | Yamaguchi | ............... | F21V 5/04 362/217.02 |
| 8,328,403 B1* | 12/2012 | Morgan | .................. | G02B 6/26 362/606 |
| 8,414,162 B2* | 4/2013 | Pijlman | ................ | G02B 6/0021 362/339 |
| 8,585,239 B1* | 11/2013 | Tseng | ........................ | F21V 5/04 362/244 |
| 9,028,109 B2* | 5/2015 | Takatori | ............. | G02B 19/0014 362/308 |
| 9,074,754 B2* | 7/2015 | Liao | ..................... | G02B 6/0035 |
| 9,175,832 B2* | 11/2015 | Sy | ............................. | F21V 13/04 |
| 9,366,396 B2* | 6/2016 | Yuan | .......................... | F21K 9/52 |
| 9,546,773 B2* | 1/2017 | Yamaguchi | .......... | G02B 3/0037 |
| 2006/0083000 A1 | 4/2006 | Yoon et al. | | |
| 2010/0270907 A1 | 10/2010 | Yamaguchi et al. | | |
| 2014/0119027 A1 | 5/2014 | Takatori | | |
| 2017/0115531 A1* | 4/2017 | Hiraka | .................... | F21V 5/046 |

FOREIGN PATENT DOCUMENTS

| | | |
|---|---|---|
| JP | 2012-195220 A | 10/2012 |
| JP | 2014-086343 A | 5/2014 |

OTHER PUBLICATIONS

Supplementary Partial European Search Report for 15868259.1 dated Jun. 5, 2018.

\* cited by examiner

LIGHT-EMITTING DEVICE WITH LIGHT FLUX CONTROL MEMBER HAVING PRISMATIC ELEMENTS ON BOTTOM SURFACE FORMING ACUTE ANGLE WITH SIDE EDGE OF LIGHT SOURCE

TECHNICAL FIELD

The present invention relates to a light emitting device and a light flux controlling member that is provided in the light emitting device.

BACKGROUND ART

In recent years, light emitting diodes (hereinafter also referred to as "LEDs") are used as a light source for illumination from a view point of energy saving and downsizing. Light emitting devices using a combination of an LED and a light flux controlling member that controls the distribution of light emitted from the LED are used in place of fluorescent lamps and halogen lamps. In addition, direct surface light source devices incorporating the light emitting device are used as a backlight in image display devices of transmission type such as liquid crystal display apparatuses (for example, PTL 1).

The surface light source device disclosed in PTL 1 includes a substrate, a light emitting element (light emitting chip) disposed on the substrate, a light flux controlling member (lens) disposed on the substrate to cover the light emitting element and to control the distribution of the light emitted from the light emitting element, and a light diffusion member configured to allow the light emitted from the light flux controlling member to pass therethrough while diffusing the light. The light flux controlling member includes an incidence surface on which light emitted from the light emitting element is incident, an emission surface configured to emit, to the outside, the light incident on the incidence surface, and a rear surface formed on the side opposite to the emission surface. The light emitted from the light emitting element is incident on the light flux controlling member from the incidence surface. The light incident on the light flux controlling member reaches the emission surface and is emitted from the emission surface to the outside.

CITATION LIST

Patent Literature

PTL 1
Japanese Patent Application Laid-Open No. 2006-114863

SUMMARY OF INVENTION

Technical Problem

Disadvantageously, in the surface light source device disclosed in PTL 1, a bright spot (bright band) having a ring-band shape is generated on the light diffusion member due to light incident on the rear surface of the light flux controlling member.

It is conceivable to form a lattice-like protrusion or a lattice-like recess on the rear surface of the light flux controlling member for the purpose of reducing generation of the above-mentioned bright spot having a ring-band shape. In the case of a surface light source device including such a light flux controlling member, it is recognized that generation of the bright spot having a ring-band shape can be suppressed by diffusing light reaching the rear surface of the light flux controlling member by the lattice-like protrusion or the lattice-like recess.

In addition, in recent years, with reduction in thickness of surface light source devices, a light emitting element and a light flux controlling member are disposed at positions close to each other in some situation. When the light emitting element and the light flux controlling member are disposed at a positions close to each other in a surface light source device including the above-described light flux controlling member in which a lattice-like protrusion or a lattice-like recess is formed on the rear surface, a part of light incident on the incidence surface reaches the slope surface composed of the lattice-like protrusion or the lattice-like recess inside the light flux controlling member. Then, the part of light reaching the slope surface formed by the lattice-like protrusion or the lattice-like recess inside the light flux controlling member internally reflected and emitted from the emission surface. As a result, when a light emitting element and a surface light source device are disposed at positions close to each other in the surface light source device including the light flux controlling member in which the lattice-like protrusion or the lattice-like recess is formed, illuminance unevenness can be disadvantageously caused due to light internally reflected by the lattice-like protrusion or the lattice-like recess of the light diffusion member of the light flux controlling member.

In view of this, an object of the present invention is to provide a light emitting device and a light flux controlling member which can suppress unevenness in illuminance even in the case where a light emitting element and a light flux controlling member are disposed at positions close to each other.

Solution to Problem

A light emitting device of an embodiment of present invention includes: a light emitting element having a rectangular shape in plan view, and configured to emit light; and a light flux controlling member including an incidence surface which is an internal surface of a recess disposed to intersect a light axis of the light emitting element, the incidence surface being configured to allow incidence of light emitted from the light emitting element, a rear surface extending from an edge of an opening of the recess in a radial direction to surround the light axis, the rear surface being a surface on which a lattice-like protrusion line composed of a plurality of protrusion lines disposed in a lattice shape or a lattice-like recess line composed of a plurality of recess lines disposed in a lattice shape is formed, and an emission surface disposed on a side opposite to the rear surface and configured to emit light incident on the incidence surface. In plan view, a smaller angle between each of four sides of an outer edge of the light emitting element and a first virtual line parallel to a ridgeline of the lattice-like protrusion line or a valley line of the lattice-like recess line is an acute angle.

In addition, a light flux controlling member of an embodiment of the present invention is configured to control a distribution of light emitted from a light emitting element, the light flux controlling member including: an incidence surface which is an internal surface of a recess formed on a rear side to intersect a central axis of the light flux controlling member; a rear surface extending from an edge of an opening of the recess in a radial direction to surround the central axis; and an emission surface disposed on a side opposite to the rear surface side to intersect the central axis.

A lattice-like protrusion line or a lattice-like recess line is disposed on the rear surface, the lattice-like protrusion line including a plurality of annular protrusions disposed to surround the central axis and a plurality of radial protrusion lines radially disposed around the central axis, the lattice-like recess line including a plurality of annular recesses disposed to surround the central axis and a plurality of radial recess lines radially disposed around the central axis.

Advantageous Effects of Invention

The light emitting device of the embodiments of the present invention can suppress unevenness in illuminance even in the case where a light emitting element and a light flux controlling member are disposed at positions close to each other, in comparison with conventional light emitting devices.

DESCRIPTION OF EMBODIMENTS

In the following, embodiments of the present invention will be described in detail with reference to the accompanying drawings.

Embodiment 1

(Configuration of Light Emitting Device)

Figure 1:
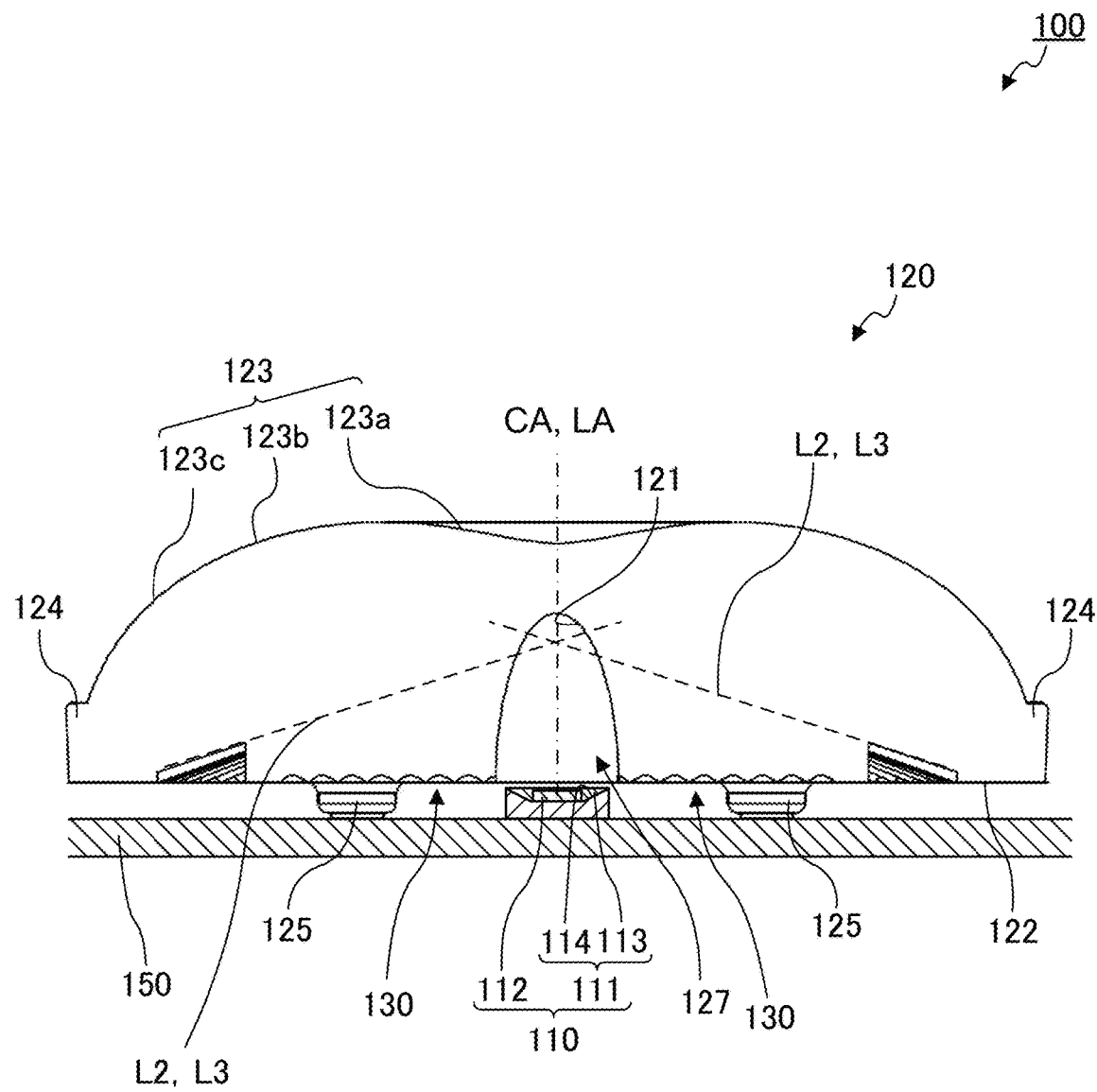
FIG. 1 is a sectional view of a light emitting device according to Embodiment 1.

FIG. 1 is a sectional view of light emitting device 100 according to Embodiment 1.

As illustrated in FIG. 1, light emitting device 100 includes light emitting element package 110, and light flux controlling member 120 configured to control the distribution of light emitted from light emitting element package 110. It is to be noted that, in FIG. 1, hatching of the cross section in light flux controlling member 120 is omitted.

Light emitting element package 110 is, for example, a light emitting diode (LED) such as a white light emitting diode. Light emitting element package 110 is disposed on substrate 150, for example. Light emitting element package 110 includes package substrate 111 and light emitting element (die) 112. At the top surface of package substrate 111, cavity 113 is formed. Internal surface 114 of cavity 113 functions as a reflecting surface. The material of package substrate 111 is ceramic, resin or the like. Light emitting element 112 is disposed at the bottom surface of cavity 113. With light emitting element 112 disposed at the bottom surface of cavity 113, sealing resin such as epoxy resin and silicone resin is encapsulated in cavity 113. In the present embodiment, light emitting element package 110 has a rectangular shape in plan view.

Figure 2A:
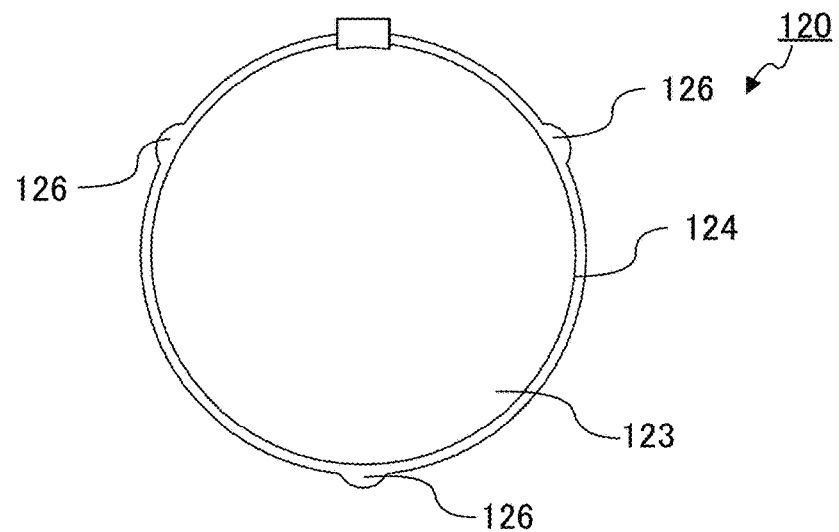
FIG. 2A to FIG. 2E illustrate a configuration of a light flux controlling member according to Embodiment 1.
Figure 2B:
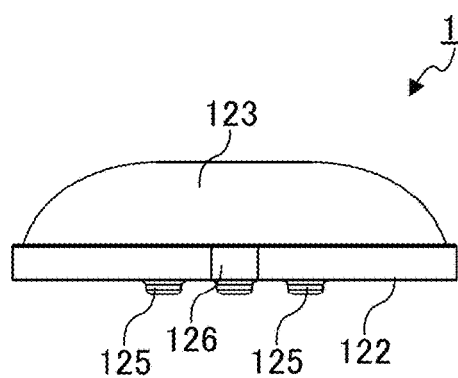
Figure 2C:
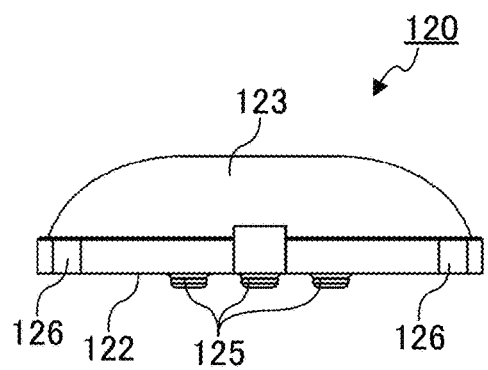
Figure 2D:
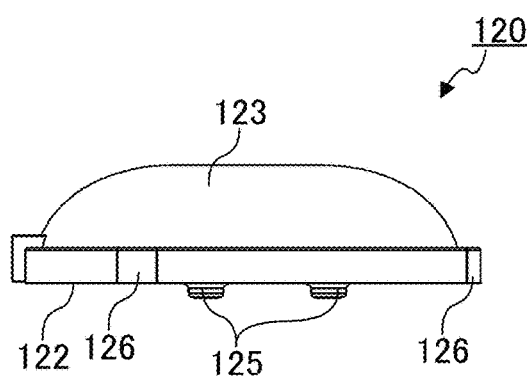
Figure 2E:
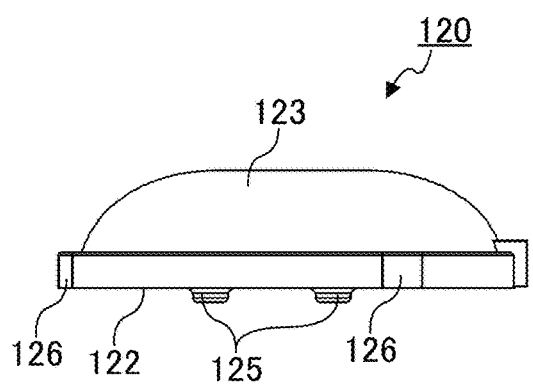
Figure 3A:
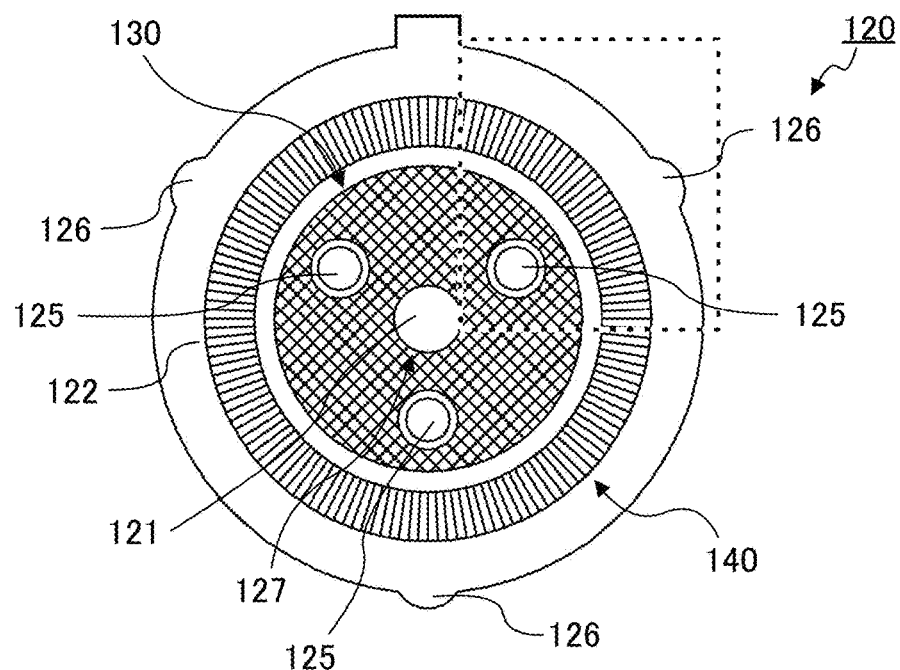
FIG. 3A and FIG. 3B are bottom views of the light flux controlling member according to Embodiment 1.
Figure 3B:
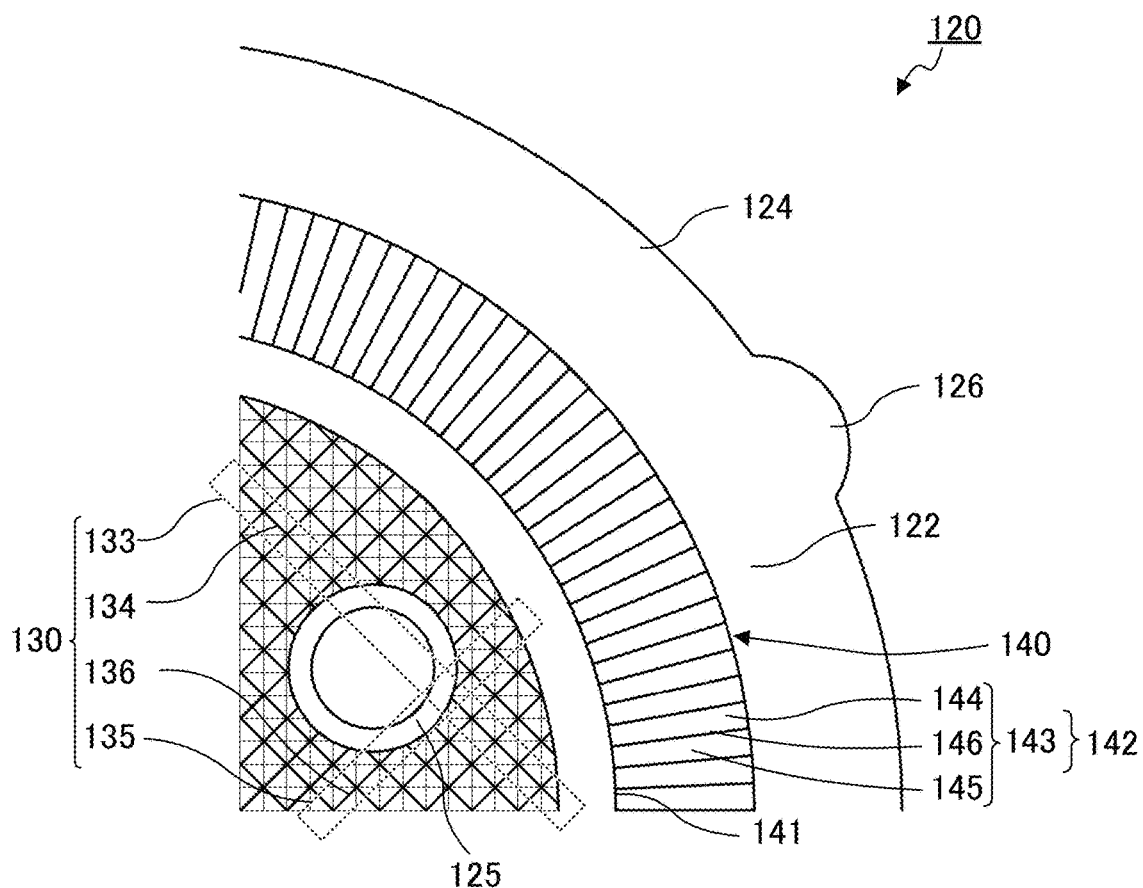

FIG. 2A to FIG. 3B illustrate a configuration of light flux controlling member 120. FIG. 2A is a plan view of light flux controlling member 120, FIG. 2B is a front view of light flux controlling member 120, FIG. 2C is a rear view of light flux controlling member 120, FIG. 2D is a left side view of light flux controlling member 120, and FIG. 2E is a right side view of light flux controlling member 120. In addition, FIG. 3A is a bottom view of light flux controlling member 120, and FIG. 3B is an enlarged view of the region surrounded by the broken line in FIG. 3A.

As illustrated in FIG. 2A to FIG. 3B, light flux controlling member 120 includes incidence surface 121 as the internal surface of recess 127, rear surface 122, and emission surface 123. In addition, light flux controlling member 120 may include flange part 124 disposed outside emission surface 123, leg part 125 for fixing light flux controlling member 120 to substrate 150 in such a manner as to set the position of light flux controlling member 120, and protrusion 126 configured to indicate the position of leg part 125. Light flux controlling member 120 is mounted on substrate 150 by fixing leg part 125 to substrate 150 in such a manner as to set the position of leg part 125 with protrusion 126 as a mark. At this time, in the relationship with light emitting element package 110, light flux controlling member 120 is mounted on substrate 150 such that light axis LA of light emitting element 112 coincides with central axis CA of light flux controlling member 120 (see FIG. 1). While the number of light emitting element package 110 is one in the present embodiment, a plurality of light emitting element packages 110 may be disposed for each light flux controlling member 120. In the case where a plurality of light emitting element packages 110 are disposed, light axis LA is the light travelling direction at the center of the stereoscopic light flux from a plurality of light emitting element packages 110.

Light flux controlling member 120 is formed by integral molding. The material of light flux controlling member 120 is not limited as long as light of a desired wavelength can pass therethrough. Examples of the material of light flux controlling member 120 include light-transmissive resins such as polymethylmethacrylate (PMMA), polycarbonate (PC), and epoxy resin (EP), and glass.

Recess 127 is formed at a center portion on the rear side (light emitting element package 110 side) of light flux controlling member 120 in such a manner as to intersect light axis LA of light emitting element 112 (central axis CA of light flux controlling member 120). The internal surface of recess 127 functions as incidence surface 121. Incidence surface 121 allows most or all of light emitted from light emitting element package 110 to enter flux controlling member 120 while controlling the travelling direction of the light. Incidence surface 121 intersects central axis CA of light flux controlling member 120, and is substantially rotationally symmetrical about (circularly symmetrical) central axis CA.

Rear surface 122 is a plane which is located on the rear side of light flux controlling member 120 and extends in the radial direction from the edge of the opening of recess 127. Rear surface 122 causes diffuse reflection of a part of light emitted from light emitting element package 110, which is incident on incidence surface 121 and reflected by emission surface 123. In addition, rear surface 122 causes diffuse reflection of light emitted from light emitting element package 110 at a large angle with respect to light axis LA. Rear surface 122 is a feature of the present invention, and the configuration of rear surface 122 is specifically described later.

Emission surface 123 is formed on the front side of light flux controlling member 120 in such a manner as to protrude from flange part 124. Emission surface 123 emits the light having entered light flux controlling member 120 to the outside while controlling the travelling direction of the light. Emission surface 123 intersects central axis CA, and rotationally symmetrical (circularly symmetrical) about central axis CA.

Emission surface 123 includes first emission surface 123a located in a predetermined range around central axis CA, second emission surface 123b continuously formed at the periphery of first emission surface 123a, and third emission surface 123c configured to connect second emission surface 123b and flange part 124 (see FIG. 1). First emission surface 123a is a smooth curved surface protruding in the light axis direction. First emission surface 123a has a recessed shape which is obtained by cutting out a part of a sphere. Second emission surface 123b is a smooth curved surface located at a periphery of first emission surface 123a and protruding in the light axis direction. Second emission surface 123b has a circular protruding shape. Third emission surface 123c is a curved surface located at a periphery of second emission surface 123b. In the cross section illustrated in FIG. 1, the cross section of third emission surface 123c may have a linear shape or a curved line shape.

Next, with reference to FIG. 3A and FIG. 3B, rear surface 122 is described in detail. On rear surface 122, lattice-like protrusion line 130, and annular groove 140 are formed.

As illustrated in FIG. 3A and FIG. 3B, lattice-like protrusion line 130 is disposed to surround recess 127. The shape of the unit structure of the lattice in plan view is not limited. Examples of the shape of the unit structure of the lattice in plan view include a triangular shape (triangular lattice), a square shape (square lattice), a hexagonal shape (hexagonal lattice) and the like. In the present embodiment, the shape of the unit structure of the lattice is square (square lattice) in plan view. Lattice-like protrusion line 130 includes a plurality of first protrusion lines 133, and a plurality of second protrusion lines 135. First protrusion line 133 and second protrusion line 135 have the same shape, and therefore first protrusion line 133 is described below.

First protrusion lines 133 on rear surface 122 extend in the first direction, and are arranged in the second direction perpendicular to the first direction. The distance between first protrusion lines 133 adjacent to each other in the second direction is not limited. In the present embodiment, first protrusion lines 133 adjacent to each other in the second direction are arranged with no gap therebetween. The cross-sectional shape of first protrusion line 133 in the direction orthogonal to the extending direction is not limited as long as diffuse reflection of light reaching first protrusion line 133 can be caused. Examples of the cross-sectional shape of first protrusion line 133 in the second direction include a triangular shape, a triangular shape with a rounded apex, a semicircular shape and the like. In the present embodiment, the cross-sectional shape of first protrusion line 133 in the second direction is a triangular shape. In addition, first ridgeline 134 of first protrusion line 133 is a straight line. It is to be noted that the groove formed by first protrusion lines 133 adjacent to each other may have a round shape.

Second protrusion lines 135 on rear surface 122 extend in the second direction, and are arranged in the first direction. Thus first protrusion lines 133 and second protrusion lines 135 are disposed such that first ridgeline 134 and second ridgeline 136 are perpendicular to each other. Accordingly, a plurality of recesses having a square pyramid shape are formed at the portions surrounded by first protrusion lines 133 and second protrusion lines 135.

Preferably, lattice-like protrusion line 130 is as fine as possible in a range allowing metal mold working for injection molding, and appropriate transferring of the shape of the metal mold in injection molding. It is to be noted that, preferably, the surface of lattice-like protrusion line 130 is properly roughened. To be more specific, when the Rz (maximum height) based on JIS B 0601-2001 is about 10 μm, a proper diffusion effect can be achieved while maintaining the effect of lattice-like protrusion line 130. To achieve such a roughening effect, the Rz (maximum height) is preferably 5 μm to 30 μm.

The region in which lattice-like protrusion line 130 is formed is not limited. Lattice-like protrusion line 130 may not be formed on the entire rear surface 122. It suffices that lattice-like protrusion line 130 is formed in a region where light from light emitting element package 110 at a large emission angle to light axis LA easily reaches.

The method for forming lattice-like protrusion line 130 is not limited. Lattice-like protrusion line 130 may be integrally shaped by injection molding as a part of light flux controlling member 120, or may be shaped by knurling or the like after light flux controlling member 120 is formed.

Annular groove 140 on rear surface 122 is formed outside lattice-like protrusion line 130 with respect to light axis LA.

Annular groove 140 reflects, in the lateral direction (outside in the radial direction with respect to central axis CA), a part of light incident on incidence surface 121, which is internally reflected by emission surface 123 toward rear surface 122. In the cross section including central axis CA, annular groove 140 has a V-like shape. Annular groove 140 includes internal slope surface 141 disposed on light axis LA (central axis CA) side, and external slope surface 142 disposed on the outside relative to internal slope surface 141.

Internal slope surface 141 is disposed to surround central axis CA (light axis LA). In the cross section including central axis CA, internal slope surface 141 is disposed along central axis CA.

In external slope surface 142, a plurality of protrusions 143 are formed. Each protrusion 143 is formed in a nearly triangular cross sectional shape, and is rotationally symmetrical about (n-fold rotational symmetry where n is the number of protrusion 143) central axis CA. Each protrusion 143 includes first slope surface 144 having a planar shape, second slope surface 145 having a planar shape, and third ridgeline 146 that is an intersection line of first slope surface 144 and second slope surface 145. Each protrusion 143 functions as a total reflection prism. As illustrated in FIG. 1, in a cross section of light flux controlling member 120 including light axis LA and third ridgeline 146, light axis LA and third virtual line L3 including third ridgeline 146 intersect each other at a position remote from rear surface 122 relative to external slope surface 142 in the light axis direction. That is, each protrusion 143 is tilted at a predetermined angle (for example) 60° with respect to central axis CA such that the front side is closer to central axis CA than the rear side (light emitting element package 110 side). Here, the "light axis direction" is the travelling direction of light emitted from light emitting element 112.

As described above, annular groove 140 reflects in the lateral direction (outside in the radial direction with respect to central axis CA) light which is reflected by emission surface 123 toward rear surface 122. At this time, light reaching annular groove 140 is sequentially reflected by first slope surface 144 and second slope surface 145 of protrusion 143 toward the lateral direction. The light reflected by annular groove 140 is emitted from flange part 124, for example.

The position of annular groove 140 is not limited, and preferably, annular groove 140 is formed in a region where a large quantity of light reflected by emission surface 123 arrives. The arrival position of the light reflected by emission surface 123 differs depending on various factors such as the shape of emission surface 123, and therefore is appropriately set in accordance with light flux controlling member 120.

It is to be noted that the positions in the direction of central axis CA of a part of rear surface 122 having a planar shape located between lattice-like protrusion line 130 and annular groove 140, and the other part of rear surface 122 having a planar shape located on radially outside relative to annular groove 140 are not limited. The part of rear surface 122 having a planar shape on the inside of annular groove 140, and the other part of rear surface 122 having a planar shape on the outside of annular groove 140 may be disposed at the same position, or different positions in the direction of central axis CA. In the present embodiment, the parts are disposed at the same position (height) in the direction of central axis CA.

Figure 4:
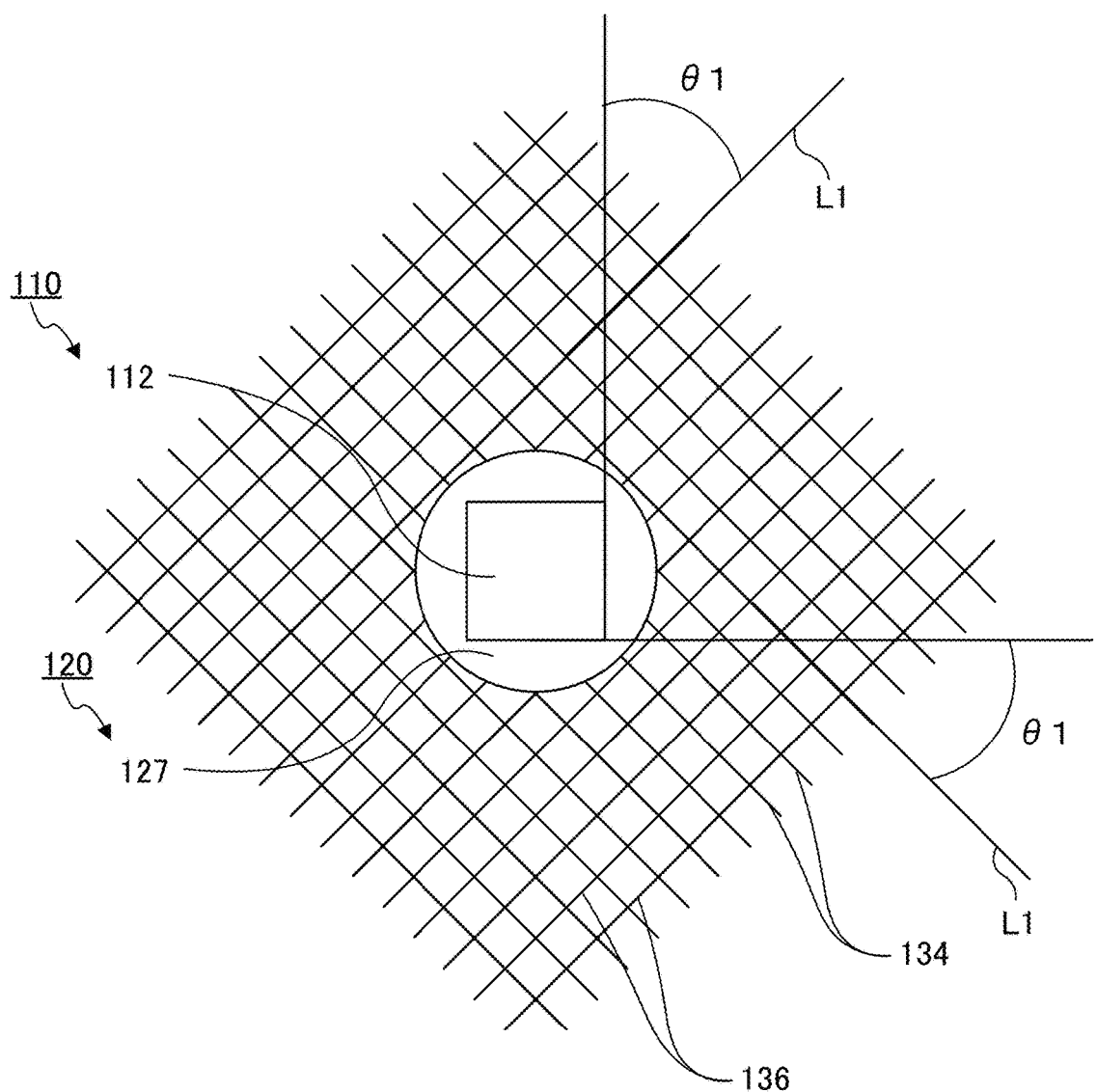
FIG. 4 is a drawing for describing a positional relationship between each of the four sides of the outer edge of a light emitting element and a lattice-like protrusion line.

FIG. 4 is a drawing for describing a positional relationship between each of the four sides of the outer edge of light emitting element 112, and lattice-like protrusion line 130. It is to be noted that FIG. 4 schematically illustrates a plan view of only light emitting element 112, recess 127, first ridgeline 134 and second ridgeline 136.

As illustrated in FIG. 4, light emitting element package 110 and light flux controlling member 120 are disposed such that smaller angle θ1 between each of the four sides of the outer edge of light emitting element package 110 and first virtual line L1 parallel to the ridgelines of lattice-like protrusion line 130 (first ridgeline 134 of first protrusion line 133 and second ridgeline 136 of second protrusion line 135) is an acute angle. In the present embodiment, light emitting element package 110 and light flux controlling member 120 are disposed such that smaller angle θ1 between each of the four sides of the outer edge of light emitting element package 110 and first virtual line L1 is 45°.

(Effect)

Since smaller angle θ1 between each of the four sides of the outer edge of light emitting element package 110 and first virtual line L1 parallel to the ridgelines of lattice-like protrusion line 130 (first ridgeline 134 of first protrusion line 133 and second ridgeline 136 of second protrusion line 135) is an acute angle as described above, light emitting device 100 according to the present embodiment can suppress unevenness in illuminance even in the case where light emitting element package 110 and light flux controlling member 120 are close to each other (see FIG. 17A to FIG. 18D).

(Modification)

Figure 5A:
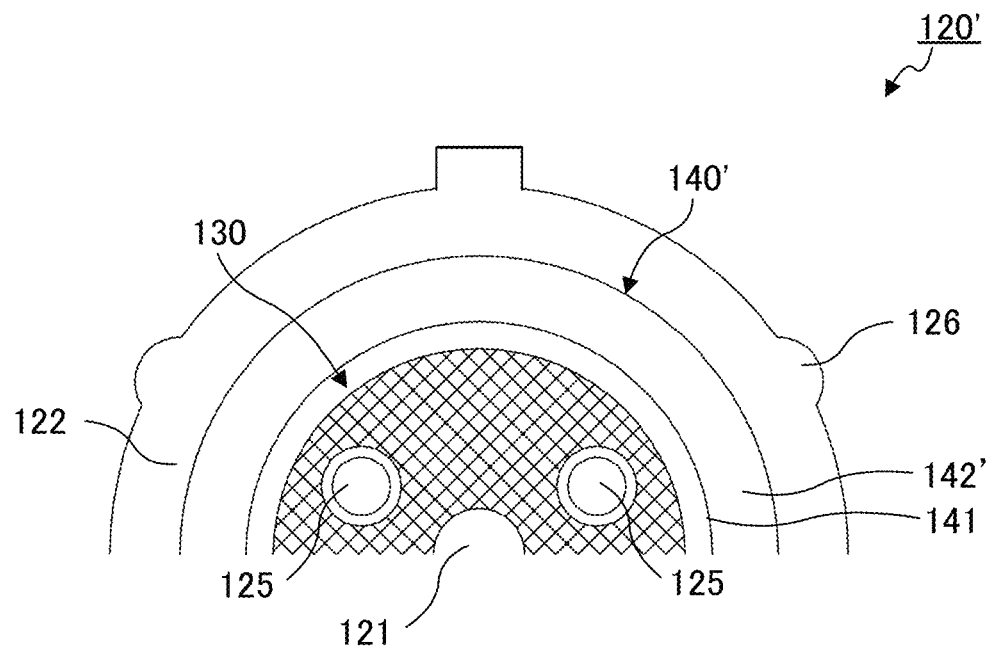
FIG. 5A and FIG. 5B illustrate a configuration of a light flux controlling member according to a modification of Embodiment 1.
Figure 5B:
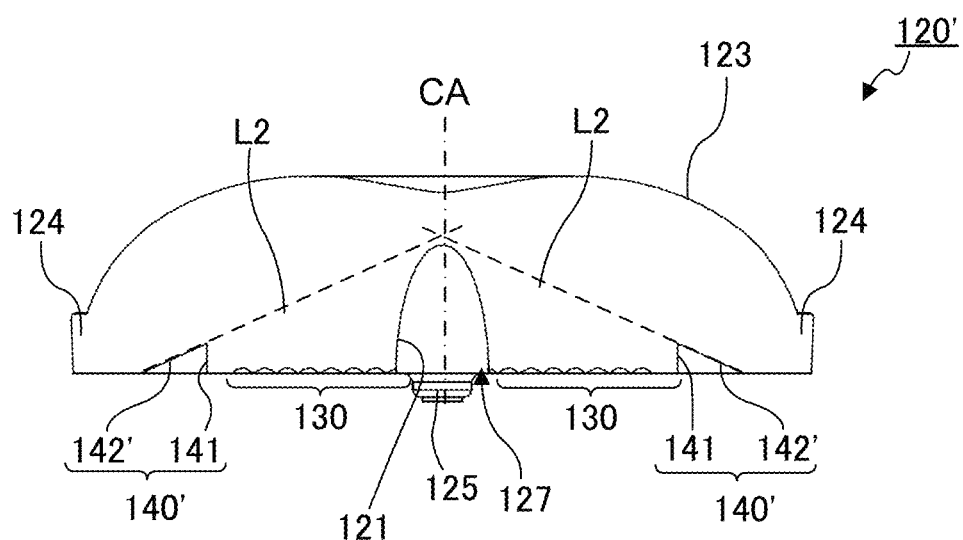

It is to be noted that, as illustrated in FIG. 5A and FIG. 5B, a plurality of protrusions 143 may not be formed in annular groove 140' in light flux controlling member 120'. In this case, annular groove 140' of light flux controlling member 120' includes internal slope surface 141 and external slope surface 142'. Internal slope surface 141 is identical to internal slope surface 141 of light flux controlling member 120 of Embodiment 1. External slope surface 142' is disposed to surround central axis CA (light axis LA). In the cross section including central axis CA, light axis LA and virtual line L2 including the cross section of external slope surface 142' intersect each other at a position remote from rear surface 122 relative to external slope surface 142' in the light axis direction.

Figure 6A:
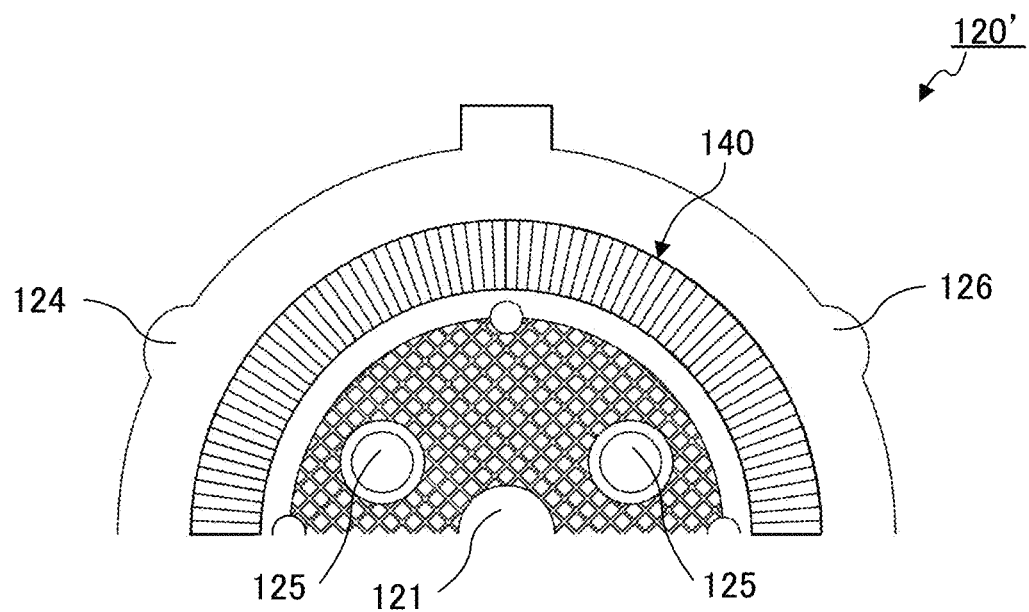
FIG. 6A and FIG. 6B illustrate a part of a bottom view of a light flux controlling member according to another modification of Embodiment 1.
Figure 6B:
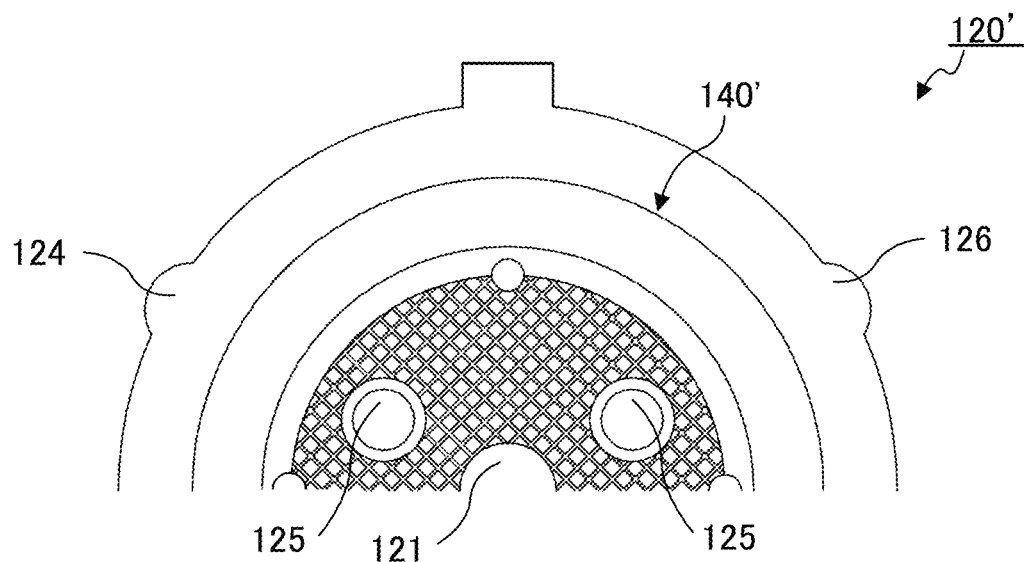

In addition, each of first protrusion line 133 and second protrusion line 135 illustrated in FIG. 6A may have a triangular cross-sectional shape with a rounded apex in the direction perpendicular to the extending direction. Also in this case, as illustrated in FIG. 6B, a plurality of protrusions 143 may not be formed in annular groove 140. In addition, although not illustrated in the drawings, it is also possible to round each side of a recess having a square pyramid shape formed by adjacent two first protrusion lines 133 and adjacent two second protrusion lines 135.

In addition, although not illustrated in the drawings, a lattice-like recess line may be formed in place of lattice-like protrusion line 130 on rear surface 122. In this case, the lattice-like recess line includes a plurality of first recess lines, and a plurality of second recess lines. The first recess lines extend in the first direction, and are arranged on rear surface 122 in the first direction perpendicular to the second direction. Examples of the cross-sectional shape of the first recess line in the second direction include a triangular shape, a triangular shape with a rounded apex, a semicircular shape and the like. In addition, the valley line of the first recess line is a straight line. The second recess lines extend in the second direction, and are arranged in the first direction. In addition, examples of the cross-sectional shape of the second recess line in the first direction include a triangular shape, a triangular shape with a rounded apex, a semicircular shape and the like. In addition, the light emitting element package and the light flux controlling member are disposed such that the smaller angle between each of the four sides of the outer edge of light emitting element package 110 and first virtual line L1 parallel to the valley line of the lattice-like recess line is an acute angle.

Embodiment 2

A light emitting device according to Embodiment 2 is different from light emitting device 100 according to Embodiment 1 only in configuration of lattice-like protrusion line 230 formed on rear surface 222 of light flux controlling member 220. In view of this, the configurations similar to those of light emitting device 100 according to Embodiment 1 will be denoted with the same reference numerals, and the description thereof will be omitted.

Figure 7:
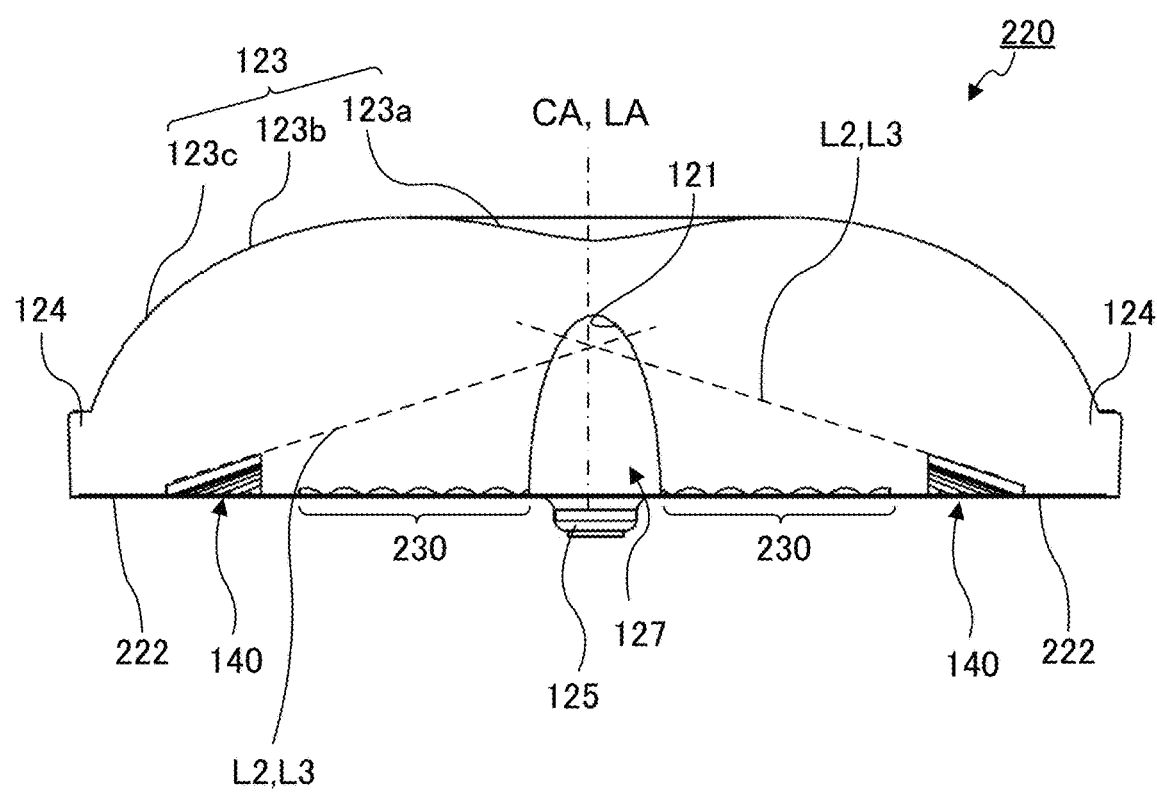
FIG. 7 is a sectional view of a light flux controlling member according to Embodiment 2.
Figure 8A:
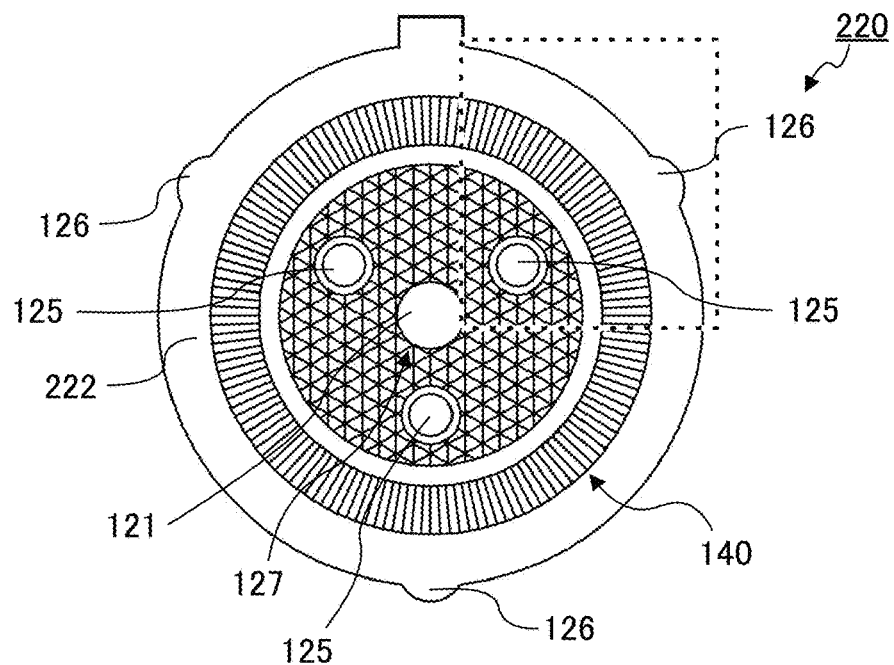
FIG. 8A and FIG. 8B are bottom views of the light flux controlling member according to Embodiment 2.
Figure 8B:
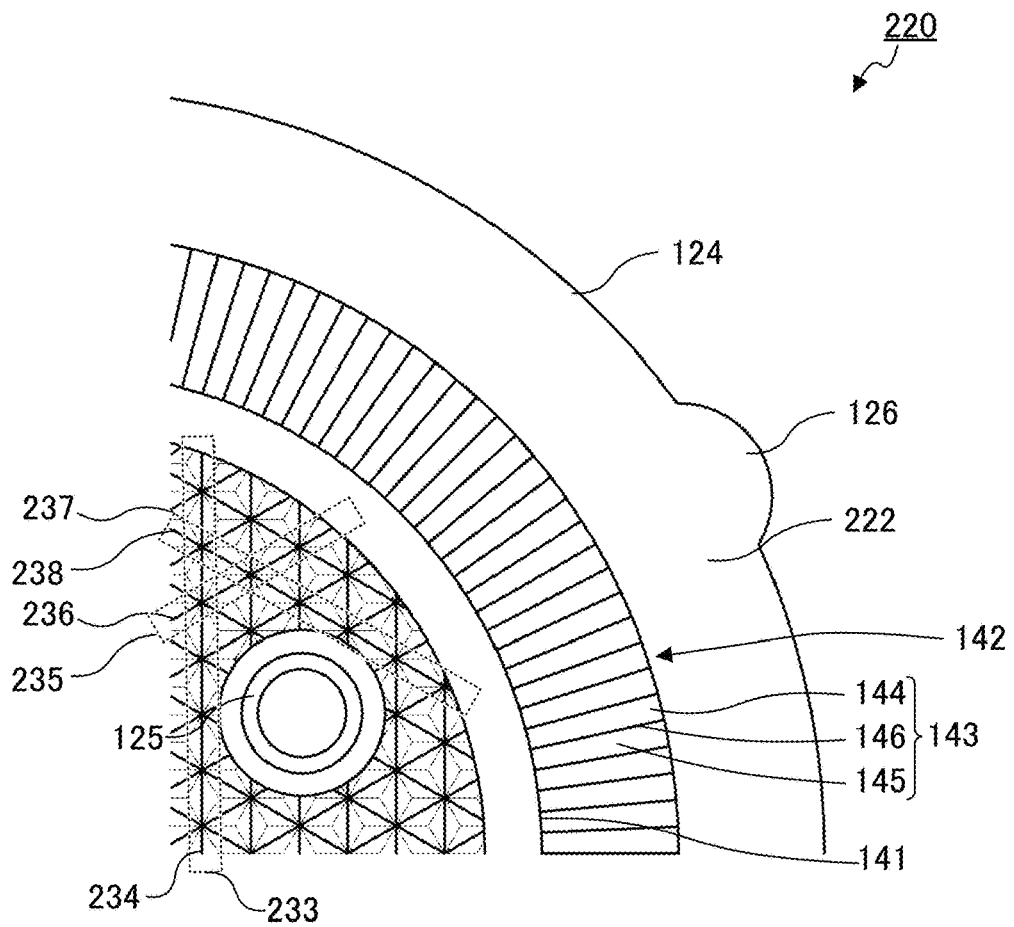

FIG. 7 is a sectional view of light flux controlling member 220 according to Embodiment 2. FIG. 8A is a bottom view of light flux controlling member 220, and FIG. 8B is an enlarged view of a region surrounded the broken line in FIG. 8A. It is to be noted that, in FIG. 7, hatching of the cross section in light flux controlling member 220 is omitted.

As illustrated in FIG. 7 to FIG. 8B, lattice-like protrusion line 230 is formed on rear surface 222 of light flux controlling member 220 according to Embodiment 2. In the present embodiment, the shape of the unit structure of the lattice in plan view is a triangular shape (triangular lattice). Lattice-like protrusion line 230 includes a plurality of third protrusion lines 233, a plurality of fourth protrusion lines 235, and a plurality of fifth protrusion lines 237. It is to be noted that third the configurations of protrusion line 233, fourth protrusion line 235 and fifth protrusion line 237 are identical to those of first protrusion line 133 and second protrusion line 135.

In plan view, third protrusion line 233 extends in a direction which is not parallel to each of the four sides of the outer edge of light emitting element 112, and is not perpendicular to each of the four sides. On rear surface 222, fourth protrusion line 235 is disposed in a direction at an angle of 60° with respect to the extending direction of third protrusion line 233 in the plane direction. In addition, on rear surface 222, fifth protrusion line 237 is disposed in a direction at an angle of 60° with respect to the extending direction of fourth protrusion line 235. That is, the smaller angle between fourth ridgeline 234 of third protrusion line 233 and fifth ridgeline 236 of fourth protrusion line 235 is 60°, and the smaller angle between fifth ridgeline 236 of the fourth protrusion line and sixth ridgeline 238 of fifth protrusion line 237 is also 60°. Accordingly, a recess having a triangular pyramidal shape is formed in a portion surrounded by third protrusion line 233, fourth protrusion line 235 and fifth protrusion line 237.

Figure 9:
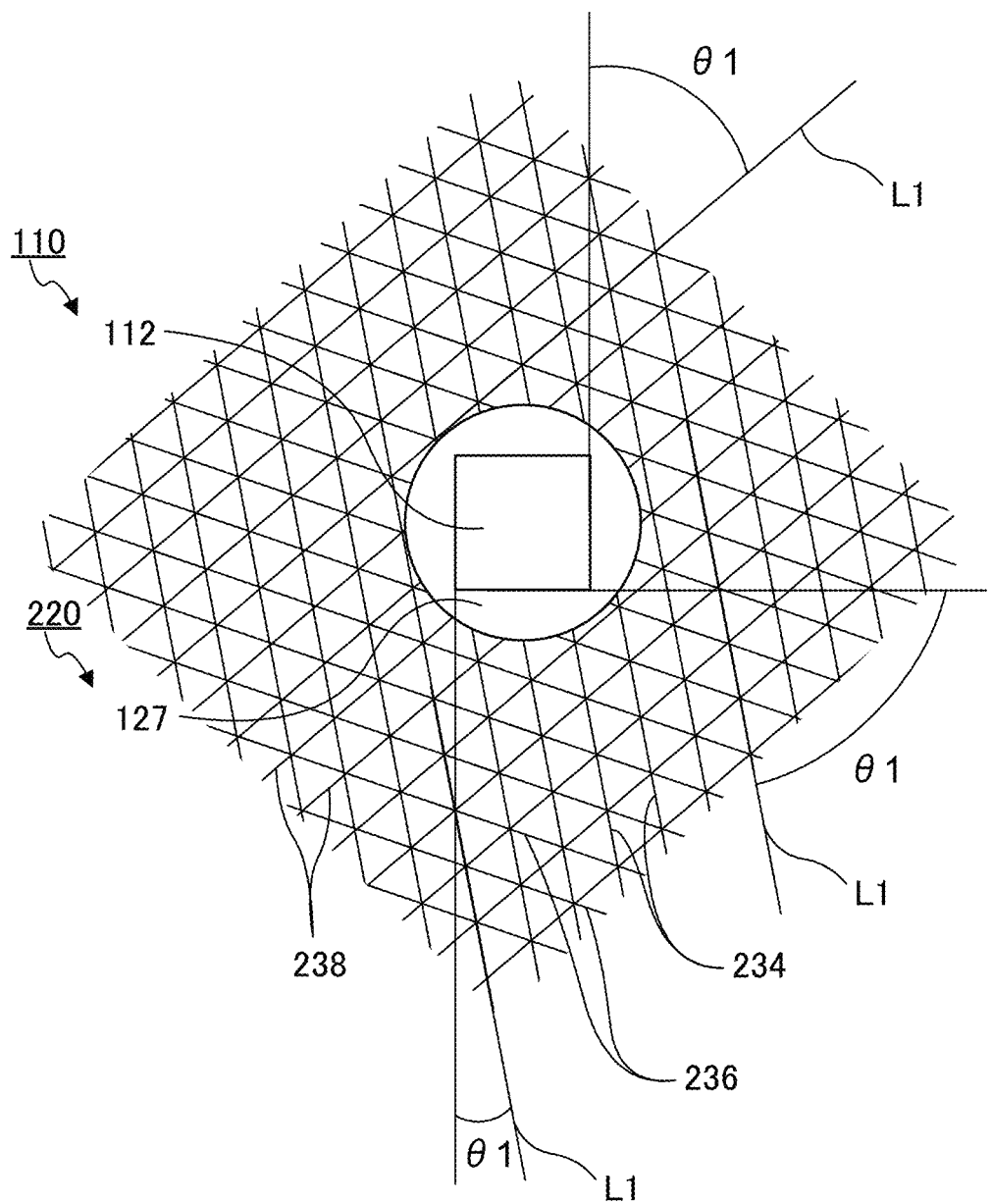
FIG. 9 is a drawing for describing a positional relationship between each of the four sides of the outer edge of a light emitting element and a lattice-like protrusion line.

FIG. 9 is a drawing for describing a positional relationship between each of the four sides of the outer edge of light emitting element 112 and lattice-like protrusion line 230. It is to be noted that FIG. 9 schematically illustrates a plan view of only light emitting element 112, recess 127, fourth ridgeline 234, fifth ridgeline 236 and sixth ridgeline 238.

As illustrated in FIG. 9, also in Embodiment 2, light emitting element package 110 and light flux controlling member 220 are disposed such that smaller angle θ1 between each side of the outer edge of light emitting element package 110 and first virtual line L1 parallel to the ridgelines (fourth ridgeline 234 of third protrusion line 233, fifth ridgeline 236 of fourth protrusion line 235 and sixth ridgeline 238 of fifth protrusion line 237) of lattice-like protrusion line 230 is an acute angle.

(Effect)

With the above-mentioned configuration, the light emitting device according to the present embodiment has an effect similar to that of Embodiment 1.

(Modification)

Figure 10A:
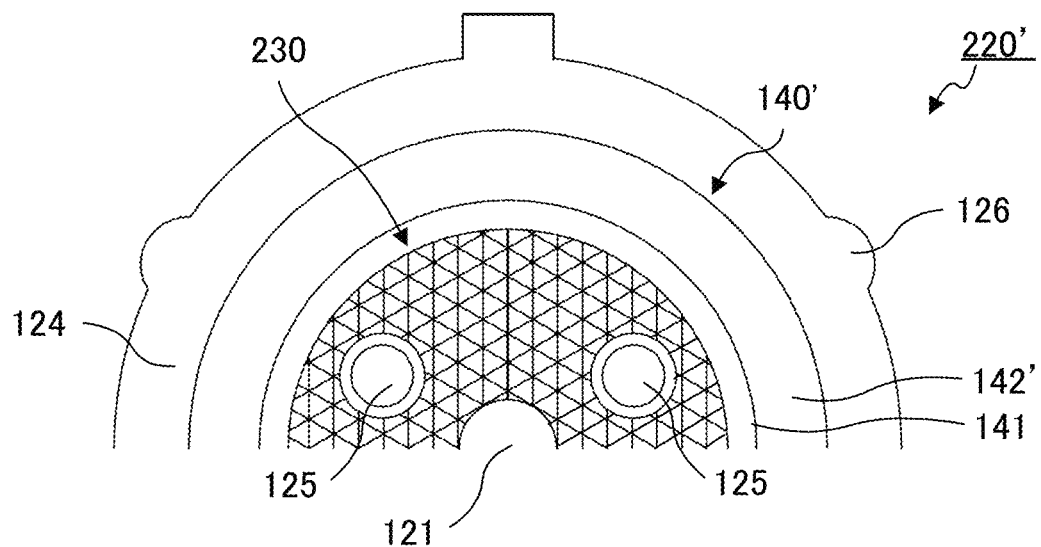
FIG. 10A and FIG. 10B illustrate a configuration of a light flux controlling member according to a modification of Embodiment 2.
Figure 10B:
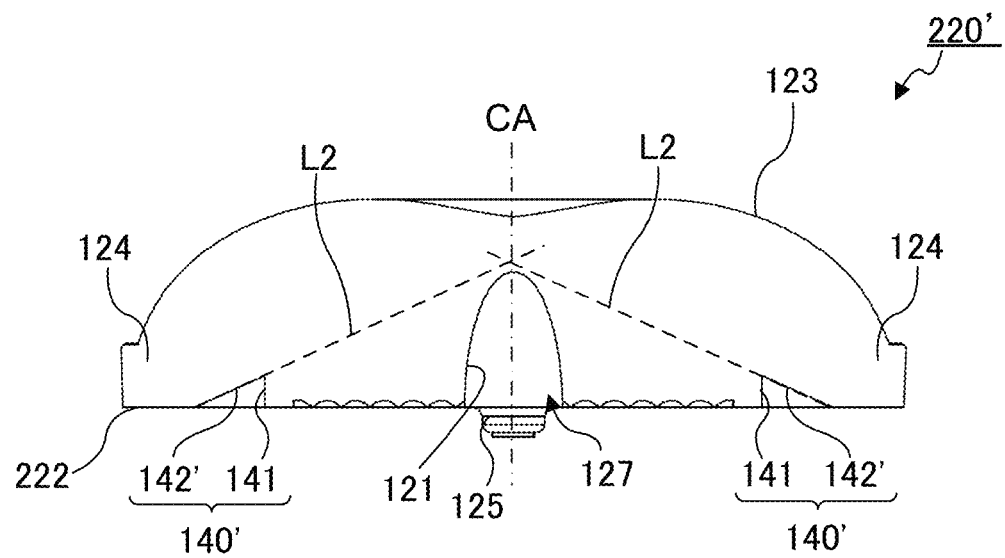

It is to be noted that, as illustrated in FIG. 10A and FIG. 10B, a plurality of protrusions 143 may not be formed in annular groove 140' in light flux controlling member 220'. In this case, annular groove 140' of light flux controlling member 220' includes internal slope surface 141 and external slope surface 142'. Internal slope surface 141 is identical to internal slope surface 141 of light flux controlling member 220 of Embodiment 2. External slope surface 142' is disposed to surround central axis CA (light axis LA). In the cross section including central axis CA, light axis LA and virtual line L2 including the cross section of external slope surface 142' intersect each other at a position remote from rear surface 222 relative to external slope surface 142' in the light axis direction.

Figure 11A:
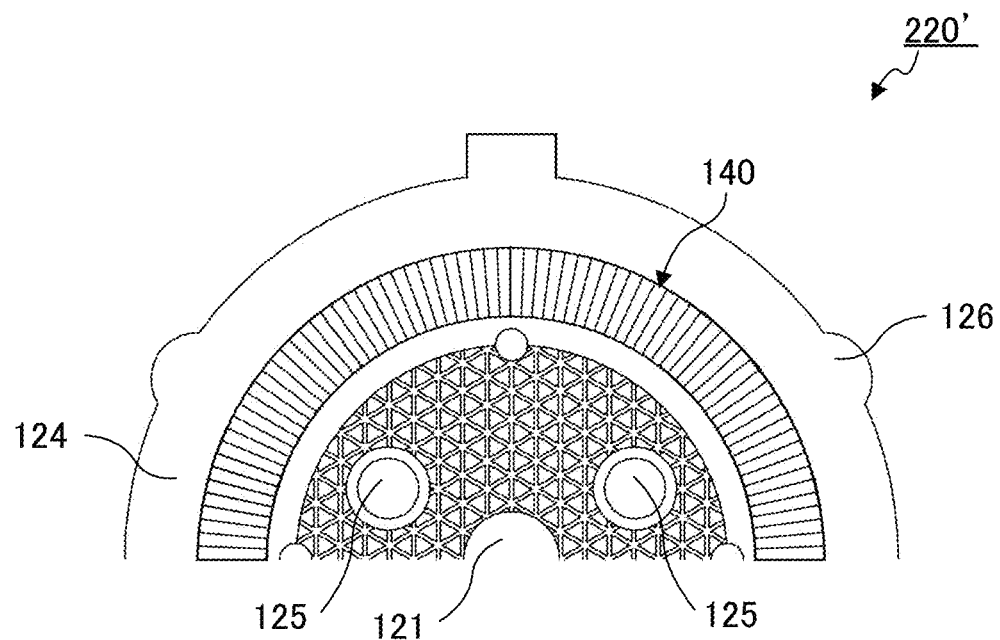
FIG. 11A and FIG. 11B illustrate a part of a bottom view of a light flux controlling member according to another modification of Embodiment 2.
Figure 11B:
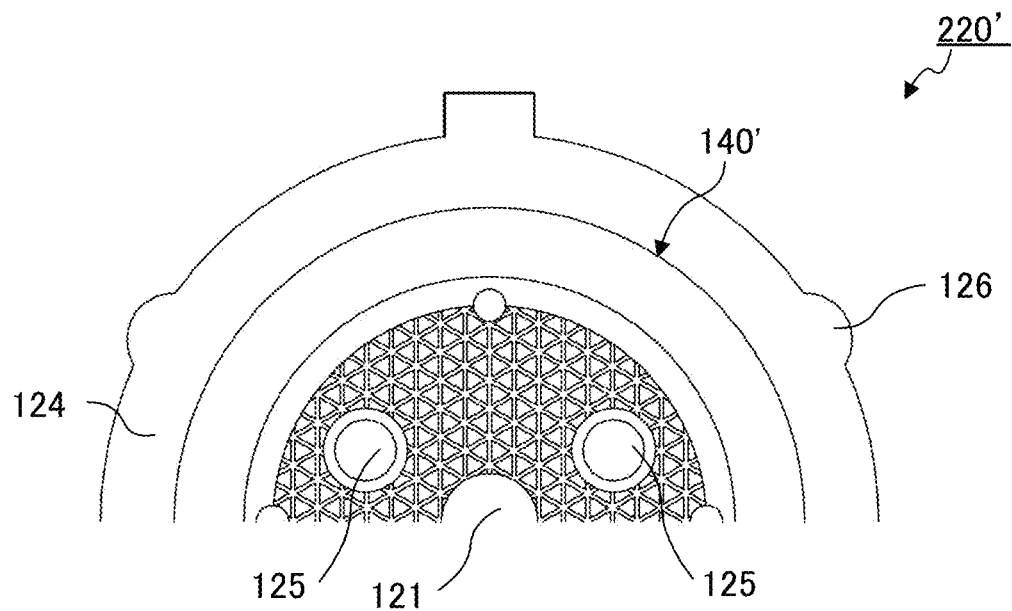

In addition, as illustrated in FIG. 11A, each of third protrusion line 233, fourth protrusion line 235 and fifth protrusion line 237 illustrated in FIG. 8B may have a triangular cross-sectional shape with a rounded apex in a direction perpendicular to the extending direction. In addition, although not illustrated in the drawings, the cross section of adjacent side surfaces may be rounded in a cross section of the triangular pyramidal shape parallel to rear surface 222. Also in this case, as illustrated in FIG. 11B, a plurality of protrusions 143 may not be formed in annular groove 140'.

In addition, although not illustrated in the drawings, a lattice-like recess line may be formed in place of lattice-like protrusion line 230 on rear surface 222. In this case, the lattice-like recess line includes a plurality of first recess lines, a plurality of second recess lines, and a plurality of third recess lines. The smaller angle between a fourth valley line of the third recess line and a fifth valley line of the fourth recess line is 60°, and the smaller angle between the fifth valley line of the fourth recess line and the sixth valley line of the fifth recess line is also 60°. Examples of the cross-sectional shape of the first recess line, the second recess line and the third recess line in directions orthogonal to the valley lines include a triangular shape, a triangular shape with a rounded apex, a semicircular shape and the like. In addition, the valley lines of the first recess line, the second recess line and the third recess line are straight lines. In addition, the light emitting element package and the light flux controlling member are disposed such that the smaller angle between each of the four sides of the outer edge of light emitting element package 110 and first virtual line L1 parallel to the valley line of the lattice-like recess line is an acute angle.

Embodiment 3

A light emitting device according to Embodiment 3 is different from light emitting device 100 according to Embodiment 1 only in configuration of lattice-like protrusion line 330 formed on rear surface 322 of light flux controlling member 320. In view of this, the configurations similar to those of light emitting device 100 according to Embodiment 1 will be denoted with the same reference numerals, and the description thereof will be omitted.

Figure 12:
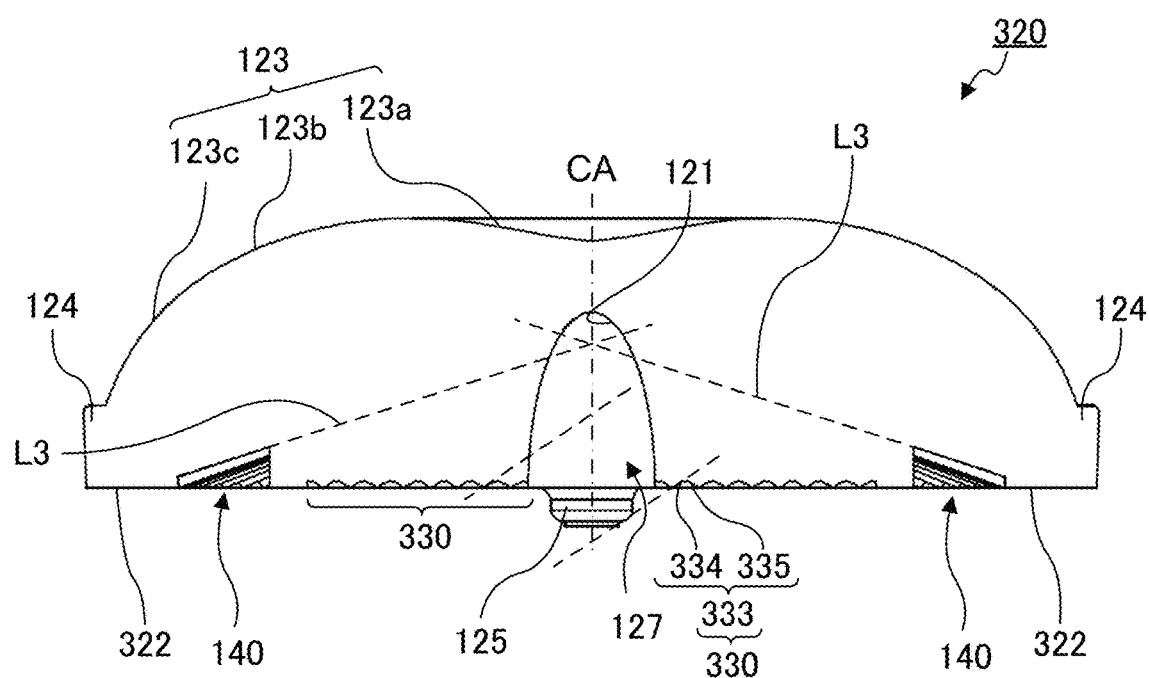
FIG. 12 is a sectional view of a light flux controlling member according to Embodiment 3.
Figure 13A:
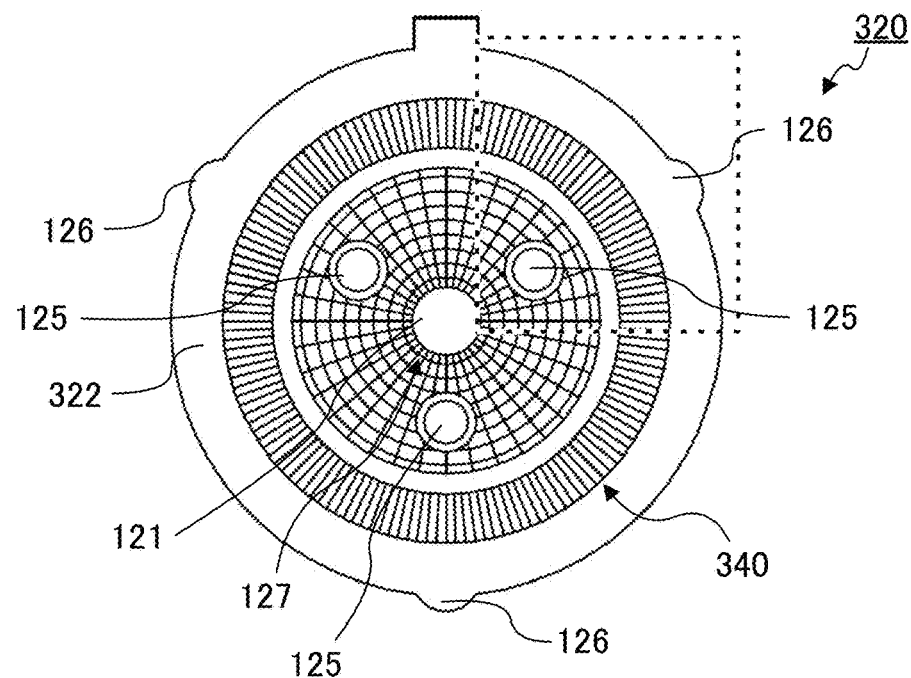
FIG. 13A and FIG. 13B are bottom views of the light flux controlling member according to Embodiment 3.
Figure 13B:
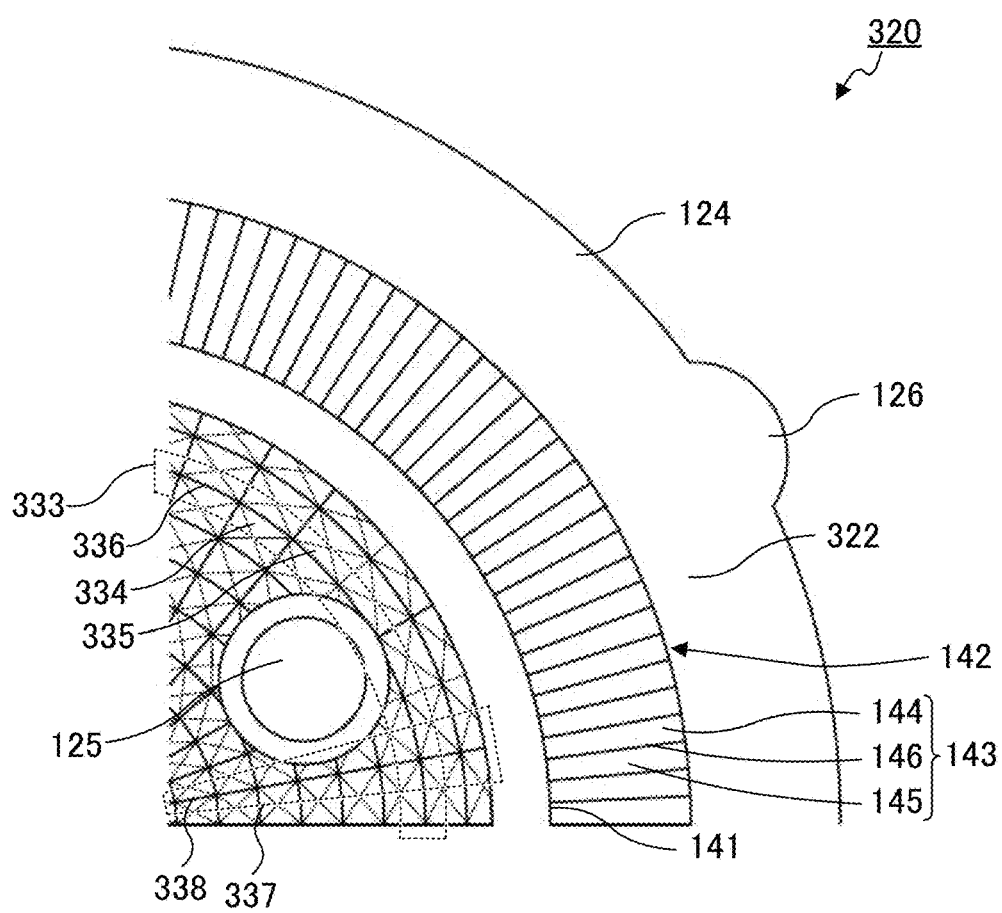

FIG. 12 is a sectional view of light flux controlling member 320 according to Embodiment 3. FIG. 13A is a bottom view of light flux controlling member 320, and FIG. 13B is an enlarged view of a region surrounded by the broken line in FIG. 13A. It is to be noted that, in FIG. 12, hatching of the cross section in light flux controlling member 320 is omitted.

As illustrated in FIG. 12 to FIG. 13B, lattice-like protrusion line 330 is formed on rear surface 322 of light flux controlling member 320 according to Embodiment 3. The shape of the unit structure of the lattice in plan view in the present embodiment is a substantially quadrangle (whose opposite two sides are straight lines and other opposite two sides are arcs). Lattice-like protrusion line 330 includes a plurality of sixth protrusion lines (annular protrusions) 333, and a plurality of seventh protrusion lines (radial protrusion lines) 337.

Sixth protrusion lines 333 on rear surface 322 are annular protrusions concentrically disposed to surround central axis CA. Sixth protrusion line 333 includes first annular surface 334, second annular surface 335 and seventh ridgeline 336. First annular surface 334 is disposed on central axis CA side. In a cross section of light flux controlling member 320 including light axis LA, light axis LA and a virtual line including first annular surface 334 intersect each other at a position separated from rear surface 322 in the light axis direction. Second annular surface 335 is disposed outside first annular surface 334. In a cross section of light flux controlling member 320 including light axis LA, light axis LA and a virtual line including second annular surface 335 intersect central axis CA (light axis LA) at a position remote from rear surface 322 in the direction opposite to the light axis direction. Seventh ridgeline 336 is an intersection line of first annular surface 334 and second annular surface 335, and is disposed on a virtual plane including rear surface 322a. A predetermined gap may or may not be provided between sixth protrusion lines 333 adjacent to each other. In the present embodiment, sixth protrusion lines 333 adjacent to each other are disposed with no gap therebetween.

Seventh protrusion line 337 on rear surface 322 is radially disposed around central axis CA. The cross-sectional shape orthogonal to eighth ridgeline 338 of seventh protrusion line 337 is not limited as long as light reaching seventh protrusion line 337 can be diffused. Examples of the cross-sectional shape of seventh protrusion line 337 in the circumferential direction include a triangular shape, a triangular shape with a rounded apex, a semicircular shape and the like. In the present embodiment, seventh protrusion line 337 has a triangular cross-sectional shape in the circumferential direction. In addition, in the present embodiment, the cross-sectional area of seventh protrusion line 337 on central axis CA side (a region around the opening of recess 127) is smaller than the cross-sectional area of seventh protrusion line 337 on the external side in the radial direction around central axis CA. The shapes of seventh protrusion lines 337 may be identical to each other or different from each other. In the present embodiment, the shapes of seventh protrusion lines 337 are identical to each other. Eighth ridgeline 338 of seventh protrusion line 337 is a straight line, and disposed on the virtual plane including rear surface 322.

The number and installation position of seventh protrusion lines 337 are not limited. In the present embodiment, 36 seventh protrusion lines 337 are provided. In addition, 36 seventh protrusion lines 337 are evenly disposed in the circumferential direction. It is to be noted that the Rz (maximum height) of the surface of lattice-like protrusion line 330 in a region around the opening of recess 127 is about 10 μm.

Figure 14:
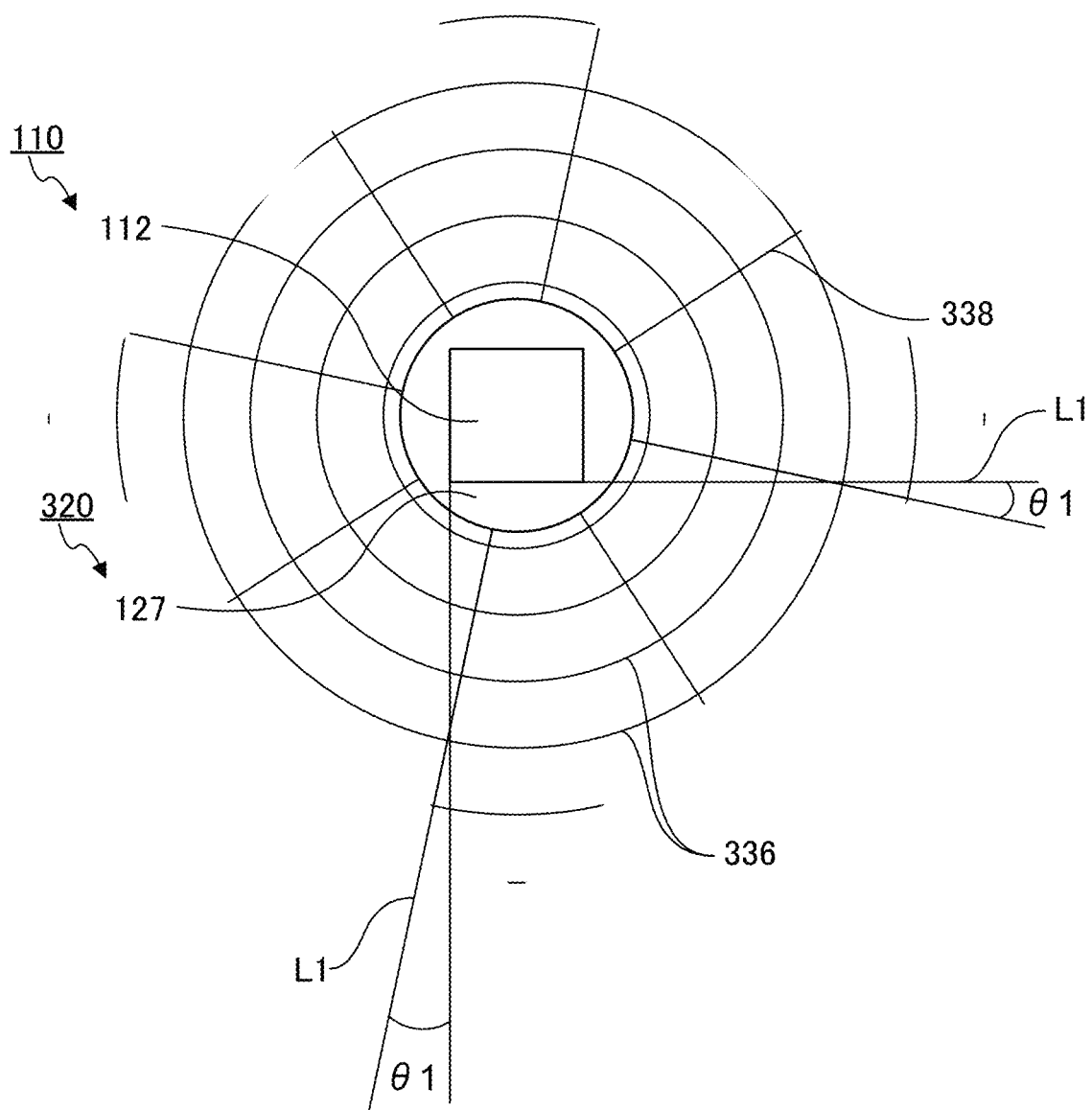
FIG. 14 is a drawing for describing a positional relationship between each of the four sides of the outer edge of a light emitting element and a lattice-like protrusion line.

FIG. 14 is a drawing for describing a positional relationship between each of the four sides of the outer edge of light emitting element 112 and a lattice-like protrusion line. It is to be noted that FIG. 14 schematically illustrates a plan view of only light emitting element 112, recess 127, seventh ridgeline 336 and eighth ridgeline 338.

As illustrated in FIG. 14, light emitting element package 110 and light flux controlling member 320 are disposed such that smaller angle θ between each of the four sides of the outer edge of light emitting element 112 and first virtual line L1 parallel to the ridgelines (seventh ridgeline 336 of sixth protrusion line 333 and eighth ridgeline 338 of seventh protrusion line 337) of lattice-like protrusion line 330 is an acute angle.

(Effect)

With the above-mentioned configuration, the light emitting device according to the present embodiment has an effect similar to that of Embodiment 1.

(Modification)

Figure 15A:
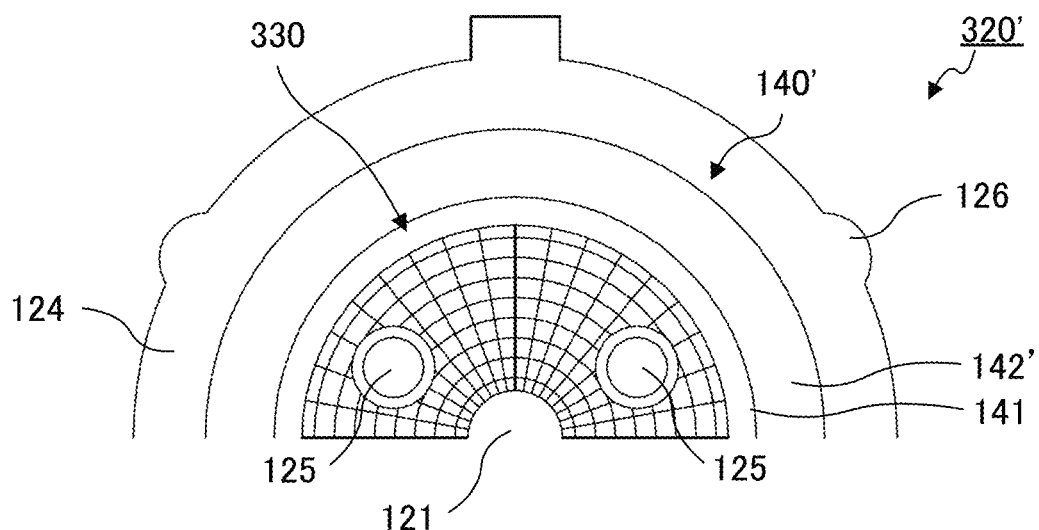
FIG. 15A and FIG. 15B illustrate a configuration of a light flux controlling member according to a modification of Embodiment 3.
Figure 15B:
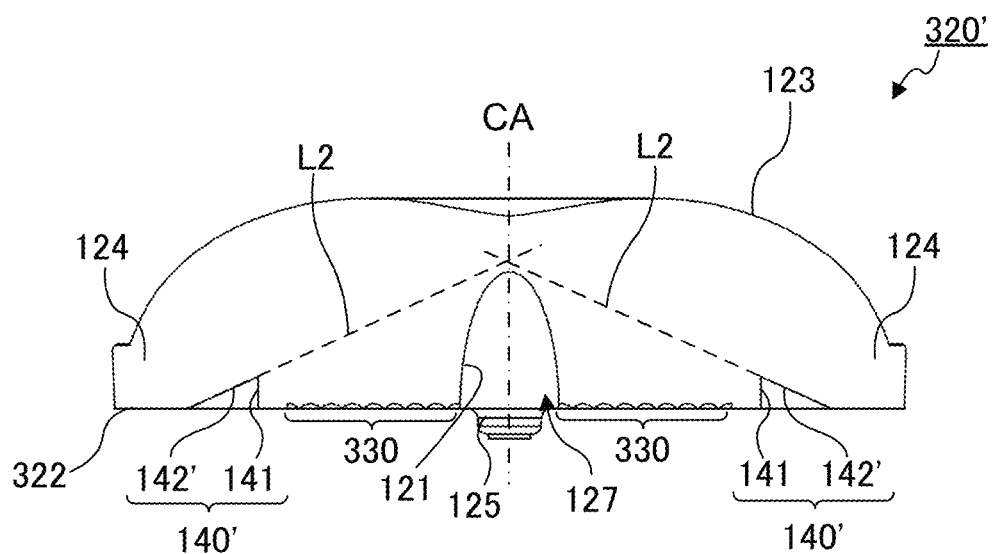

It is to be noted that, as illustrated in FIG. 15A and FIG. 15B, a plurality of protrusions 143 may not be formed in annular groove 140' in light flux controlling member 320'. In this case, annular groove 140' of light flux controlling member 320' includes internal slope surface 141 and external slope surface 142'. Internal slope surface 141 is identical to that of Embodiment 2. External slope surface 142' is disposed to surround central axis CA (light axis LA). In the cross section including central axis CA, light axis LA (central axis CA) and virtual line L2 including the cross section of external slope surface 142' intersect each other at a remote position relative to external slope surface 142' in the light axis direction.

Figure 16A:
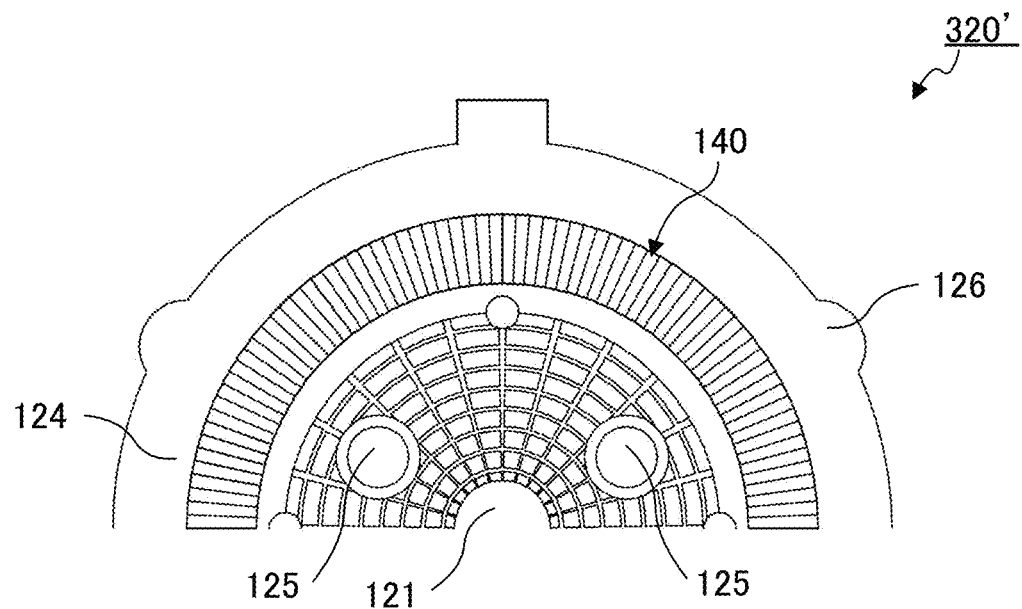
FIG. 16A and FIG. 16B illustrate a part of a bottom view of a light flux controlling member according to another modification of Embodiment 3.
Figure 16B:
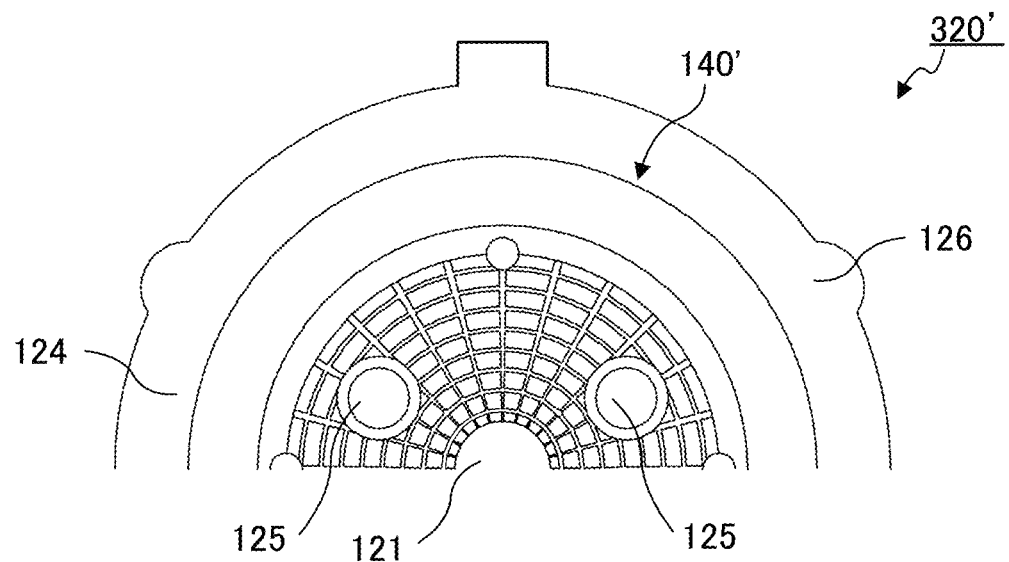

In addition, as illustrated in FIG. 16A, sixth protrusion line 333 and seventh protrusion line 337 illustrated in FIG. 13B may have a triangular cross-sectional shape with a rounded apex in a direction perpendicular to the extending direction. Also in this case, as illustrated in FIG. 16B, a plurality of protrusions 143 may not be formed in annular groove 140'.

In addition, although not illustrated in the drawings, lattice-like recess line 330 may be formed in place of lattice-like protrusion line on rear surface 322. In this case, lattice-like recess line includes a plurality of sixth recess lines, and a plurality of seventh recess lines. Sixth recess line may have a first annular surface, a second annular surface and a seventh ridgeline. First annular surface is disposed on central axis CA side. In a cross section of light flux controlling member 320' including light axis LA, light axis LA (central axis CA) and a virtual line including the first annular surface intersect central axis CA (light axis LA) at a position remote from rear surface 322 relative to emission surface 123 in the light axis direction. The second annular surface is disposed outside the first annular surface. In a cross section of light flux controlling member 320' including light axis LA, light axis LA and a virtual line including the second annular surface intersect each other at a position separated from rear surface 322 in a direction opposite to the light axis direction. Seventh ridgeline 336 is an intersection line of the first annular surface and the second annular surface, and is disposed on a virtual plane including the rear surface. Seventh recess line on the rear surface is radially disposed around central axis CA. Seventh protrusion line 337 may have a triangular cross-sectional shape in the circumferential direction. In addition, in the present embodiment, the cross-sectional area of the seventh recess line on central axis CA side (a region around the opening of recess 137) is smaller than the cross-sectional area of the seventh recess line on the outside in the radial direction around central axis CA. The eighth ridgeline of the seventh recess line is a straight line, and is disposed on a virtual plane including rear surface 322.

(Illuminance Distribution of Light Emitting Device)

Next, the light distribution characteristics of the light emitting devices according to Embodiments 1 to 3 were examined. To be more specific, the illuminance on an illumination surface which is disposed over light emitting element package 110 in parallel to the light emitting surface of light emitting element package 110 with an air layer therebetween was measured. In the measurement, the distance between the surface of substrate 150 and the illumination surface (400 mm×400 mm) is 19 mm, and the light flux controlling member has a diameter of 19 mm. In addition, in the measurement, the number of light emitting element package 110 and light flux controlling members 120, 220, and 320 is one. In addition, for comparison, the illuminance on the illumination surface was measured also with light flux controlling member 420 (also referred to as light flux controlling member 420 of Comparative example 1) in which the maximum height (Rz) is 60 μm, and the angle between each of the four sides of the outer edge of light emitting element 112 and first virtual line L1 is 90°, and light flux controlling member 520 (also referred to as light flux controlling member 520 of Comparative example 2) in which the maximum height (Rz) is 10 μm, and the smaller angle between each of the four sides of the outer edge of light emitting element 112 and first virtual line L1 is an acute angle.

Figure 17A:
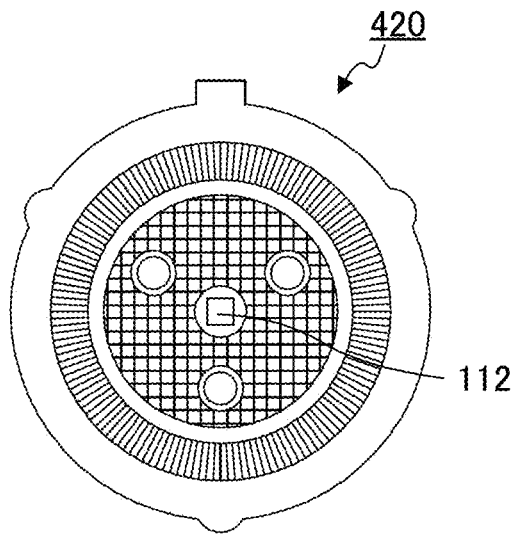
FIG. 17A to FIG. 17D are bottom views of a light flux controlling member according to Comparative examples, and graphs illustrating measurement results of the illuminance distribution.
Figure 19A:
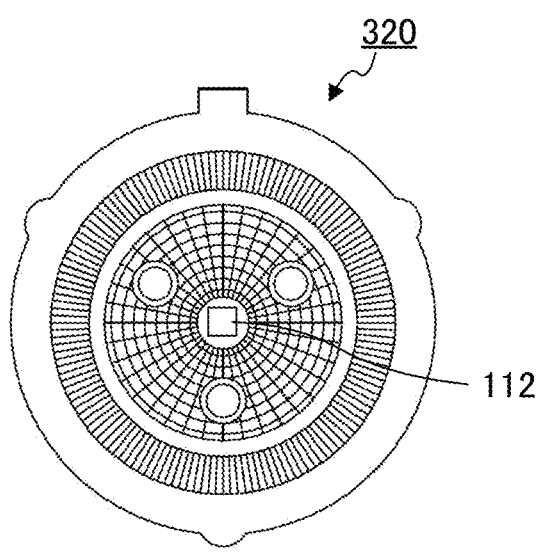
FIG. 19A and FIG. 19B are bottom views of the light flux controlling member according to the Embodiments, and graphs illustrating measurement results of the illuminance distribution.
Figure 19B:
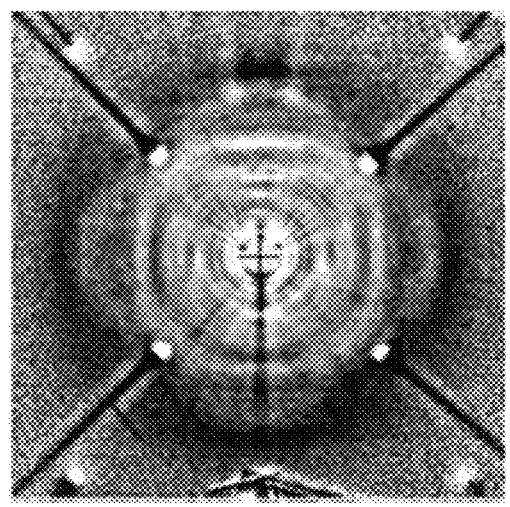

FIG. 17A to FIG. 19B are graphs illustrating the light flux controlling members used for the measurement and measurement results. FIG. 17A is a bottom view of light flux controlling member 420 according to Comparative example 1, FIG. 17B shows a measurement result obtained with light flux controlling member 420 according to Comparative example 2, FIG. 17C is a bottom view of light flux controlling member 520 according to Comparative example 2, and FIG. 17D shows a measurement result obtained with light flux controlling member 520 according to Comparative example 2. FIG. 18A is a bottom view of light flux controlling member 120 according to Embodiment 1, FIG. 18B shows a measurement result obtained with light flux controlling member 120 according to Embodiment 1, FIG. 18C is a bottom view of light flux controlling member 220 according to Embodiment 2, and FIG. 18D shows a measurement result obtained with light flux controlling member 220 according to Embodiment 2. FIG. 19A is a bottom view of light flux controlling member 320 according to Embodiment 3, and FIG. 19B shows a measurement result obtained with light flux controlling member 320 according to Embodiment 3.

It is to be noted that the illuminance distributions illustrated in FIG. 17B, FIG. 17D, FIG. 18B and FIG. 18D are corrected to emphasize the contrast on the illumination surface. Here, the method of the correction is described. In the correction, the average value of the brightness of pixels in a predetermined range around a given pixel of the obtained digital image was set to the brightness of the given pixel. This correction was performed on all pixels of the digital image. By performing this correction for all pixels in the above-mentioned manner, the contrast of the digital image can be increased.

Figure 17B:
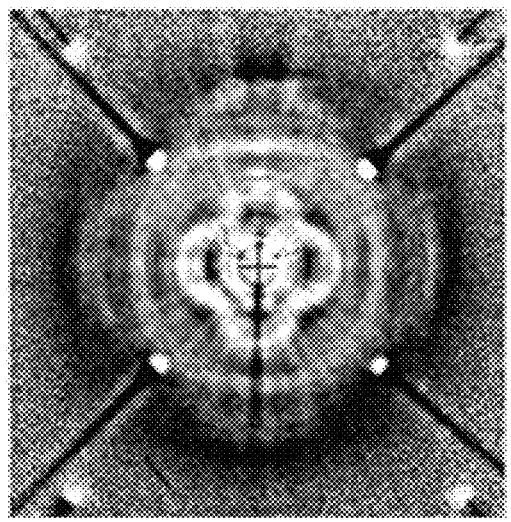
Figure 17C:
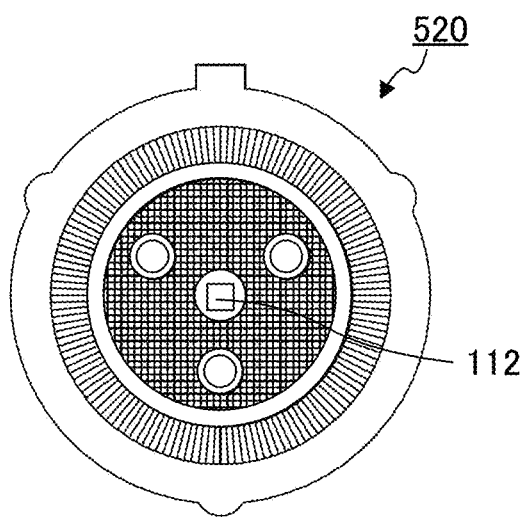
Figure 17D:
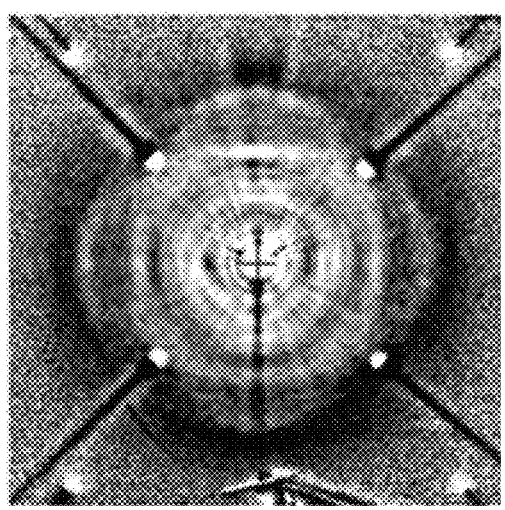
Figure 18A:
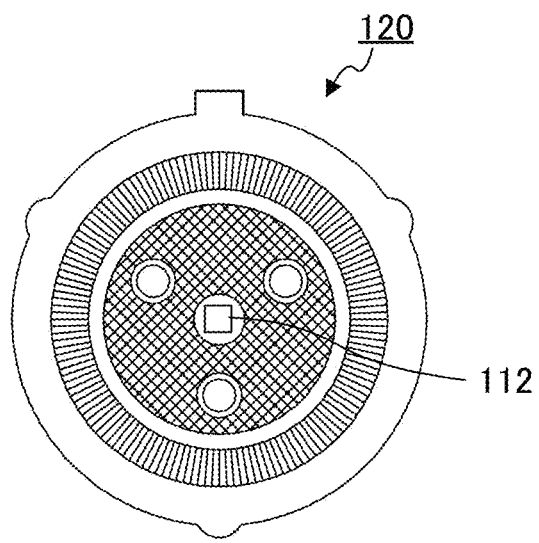
FIG. 18A to FIG. 18D are bottom views of the light flux controlling members according to the Embodiments, and graphs illustrating measurement results of the illuminance distribution.
Figure 18B:
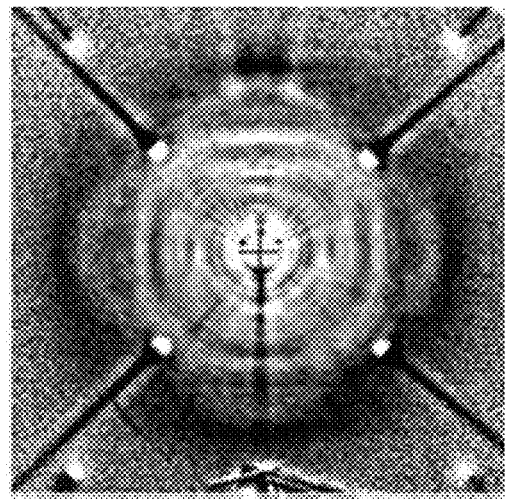
Figure 18C:
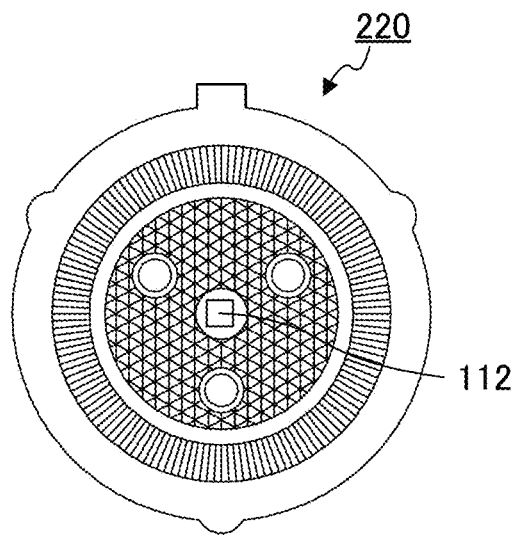
Figure 18D:
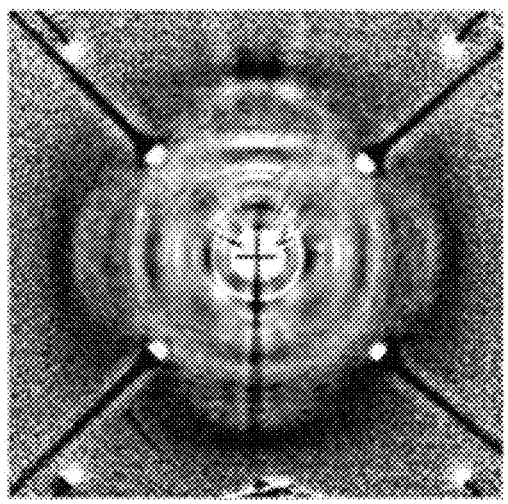

As illustrated in FIG. 17A to FIG. 17D, illuminance unevenness was caused in the light emitting devices which include light flux controlling members 420 and 520 according to Comparative examples 1 and 2 in which each of the four sides of the outer edge of light emitting element package 110 and a virtual line parallel to the ridgeline of the lattice-like protrusion line formed on rear surface 122 are parallel or orthogonal to each other. In particular, as illustrated in FIG. 17B, in the light emitting device including light flux controlling member 420 according to Comparative example 1 illustrated in FIG. 17A, illuminance unevenness of a petal-like shape was caused at a position about 40 mm from the center (the center portion in FIG. 19B) of the light emitting surface.

On the other hand, as illustrated in FIG. 18A to FIG. 19B, illuminance unevenness was suppressed in the light emitting devices which include light flux controlling members 120, 220, and 320 according to Embodiments 1 to 3 in which the smaller angle between each of the four sides of the outer edge of light emitting element package 110 and a virtual line parallel to the ridgeline of lattice-like protrusion line 130, 230, or 330 formed on rear surface 122, 222, or 322 is an acute angle.

In light flux controlling members 120, 220, and 320 according to Embodiments 1 to 3, the sizes of first protrusion line 133 and second protrusion line 135 (square pyramid recess) are small in comparison with light flux controlling member 420 of Comparative example 1 as described above, and therefore the light which causes the illuminance unevenness of a petal-like shape of light flux controlling member 420 of Comparative example 1 is not easily generated. In addition, light flux controlling members 120, 220, and 320 according to Embodiments 1 to 3 are disposed such that the smaller angle between each of the four sides of the outer edge of light emitting element package 110 and the virtual line is an acute angle, and thus the illuminance unevenness of a petal-like shape is not caused even when the light which causes the illuminance unevenness of a petal-like shape of light flux controlling member 420 of Comparative example 1 is generated. Since the size of the slope surface where the light travelling in the light flux controlling member can possibly arrive can be set to a small value with a lattice-like protrusion line in comparison with a lattice-like recess line, it is possible to suppress internal reflection and reduce the light which causes the illuminance unevenness of a petal-like shape with a lattice-like protrusion line in comparison with a lattice-like recess line.

This application is entitled to and claims the benefit of Japanese Patent Application No. 2014-248086 filed on Dec. 8, 2014, the disclosure each of which including the specification, drawings and abstract is incorporated herein by reference in its entirety.

INDUSTRIAL APPLICABILITY

The light emitting device according to the embodiments of present invention can be applied as a light source of a backlight of a liquid crystal display apparatus, signs, generally-used illumination apparatuses, and the like, for example.

REFERENCE SIGNS LIST

100 Light emitting device
110 Light emitting element package
111 Package substrate
112 Light emitting element
113 Cavity
114 Internal surface
120, 120', 220, 220'320, 320', 420, 520 Light flux controlling member
121 Incidence surface 122, 222, 322 Rear surface
123 Emission surface
123a First emission surface
123b Second emission surface
123c Third emission surface
124 Flange part
125 Leg part
126 Protrusion
127 Recess
130, 230, 330 Lattice-like protrusion line
133 First protrusion line
134 First ridgeline
135 Second protrusion line
136 Second ridgeline
140, 140' Annular groove
141 Internal slope surface
142, 142' External slope surface
143 Protrusion
144 First slope surface
145 Second slope surface
146 Third ridgeline
150 Substrate
233 Third protrusion line
234 Fourth ridgeline
235 Fourth protrusion line
236 Fifth ridgeline
237 Fifth protrusion line
238 Sixth ridgeline
333 Sixth protrusion line
334 First annular surface
335 Second annular surface
336 Seventh ridgeline
337 Seventh protrusion line
338 Eighth ridgeline

The invention claimed is:

1. A light emitting device comprising:
a light emitting element having a rectangular shape with four edge surfaces, configured to emit light and defining a light axis;
a light flux controlling member including:
a recess intersecting the light axis of the light emitting element, an inner surface of the recess being an incidence surface configured to receive light emitted from the light emitting element,
a rear surface extending from an edge of the recess in a radial direction to surround the light axis, the rear surface including a plurality of protrusion lines or a plurality of recess lines disposed to form a lattice, and
an emission surface disposed on a side opposite to the rear surface and configured to emit light incident on the incidence surface,
wherein an angle formed between a first virtual line parallel to at least one of the plurality of protrusion lines or the plurality of recess lines and a plane including one of the edge surfaces of the light emitting element is an acute angle, and
wherein each of the plurality of protrusion lines and the plurality of recess lines is a continuous straight line which is level in a side view of the lattice.

2. The light emitting device according to claim 1, wherein an angle formed between the first virtual line and the plane is 45°.

3. The light emitting device according to claim 1, wherein the lattice is a square lattice, a triangular lattice, or an annular lattice, the annular lattice including a plurality of annular protrusions disposed to surround the light axis or a plurality of annular recesses disposed to surround the light axis, and a plurality of radial protrusion lines radially disposed around the light axis or a plurality of radial recess lines radially disposed around the light axis.

4. The light emitting device according to claim 3, wherein an angle formed between the first virtual line and the plane is 45°.

5. The light emitting device according to claim 1, wherein the light flux controlling member further including:
an annular groove formed on the rear surface outside the lattice with respect to the light axis in a radial direction, the annular groove being rotationally symmetrical about the light axis, and the annular groove including:
an internal surface on the light axis side, and
a slope surface outside the internal surface with respect to the light axis; and
wherein a second virtual line including the slope surface intersects the light axis at a position remote from the rear surface in a light axis direction.

6. The light emitting device according to claim 5, wherein an angle formed between the first virtual line and the plane is 45°.

7. The light emitting device according to claim 5, wherein:
the lattice is a square lattice, a triangular lattice, or an annular lattice, the annular lattice including a plurality of annular protrusions disposed to surround the light axis or a plurality of annular recesses disposed to surround the light axis, and a plurality of radial protrusion lines radially disposed around the light axis or a plurality of radial recess lines radially disposed around the light axis.

8. The light emitting device according to claim 7, wherein an angle formed between the first virtual line and the plane is 45°.

9. The light emitting device according to claim 5, wherein:
a plurality of protrusions are disposed on the slope surface, each of the plurality of protrusions having a nearly triangular cross-sectional shape;
each of the plurality of protrusions includes a first slope surface, a second slope surface, and a ridgeline that is an intersection line of the first slope surface and the second slope surface;
the plurality of protrusions are disposed such that the plurality of protrusions are rotationally symmetrical about the light axis; and
wherein a third virtual line including the ridgeline of the plurality of protrusion intersects the light axis at a position remote from the rear surface in the light axis direction.

10. The light emitting device according to claim 9, wherein an angle formed between the first virtual line and the plane is 45°.

11. The light emitting device according to claim 9, wherein: the lattice is a square lattice, a triangular lattice, or an annular lattice, the annular lattice including a plurality of annular protrusions disposed to surround the light axis or a plurality of annular recesses disposed to surround the light axis, and a plurality of radial protrusion lines radially disposed around the light axis or a plurality of radial recess lines radially disposed around the light axis.

12. The light emitting device according to claim 11, wherein an angle formed between the first virtual line and the plane is 45°.

* * * * *